United States Patent [19]
Barth et al.

[11] Patent Number: 5,966,731
[45] Date of Patent: Oct. 12, 1999

[54] PROTOCOL FOR COMMUNICATION WITH DYNAMIC MEMORY

[75] Inventors: Richard Maurice Barth, Palo Alto; Frederick Abbot Ware, Los Altos Hills; John Bradly Dillon, Palo Alto; Donald Charles Stark, Woodside; Craig Edward Hampel, San Jose; Matthew Murdy Griffin, Mountain View, all of Calif.

[73] Assignee: Rambus, Inc., Mountain View, Calif.

[21] Appl. No.: 08/979,253

[22] Filed: Nov. 26, 1997

Related U.S. Application Data

[62] Division of application No. 08/545,292, Oct. 19, 1995, Pat. No. 5,748,914.

[51] Int. Cl.⁶ .................................................. G06F 12/00
[52] U.S. Cl. ........................... 711/167; 711/146; 711/156
[58] Field of Search ..................................... 711/146, 156, 711/167; 395/842, 308

[56] References Cited

U.S. PATENT DOCUMENTS

| | | | |
|---|---|---|---|
| 5,036,493 | 7/1991 | Nielsen | 365/230.03 |
| 5,251,178 | 10/1993 | Childers | 365/227 |
| 5,301,278 | 4/1994 | Bowater et al. | 395/275 |
| 5,345,573 | 9/1994 | Bowden, III et al. | 395/400 |
| 5,381,538 | 1/1995 | Amini et al. | 711/156 |
| 5,404,327 | 4/1995 | Houston | 365/203 |
| 5,404,463 | 4/1995 | McGarvey | 395/308 |
| 5,504,874 | 4/1996 | Galles et al. | 395/472 |
| 5,533,204 | 7/1996 | Tipley | 395/288 |
| 5,548,786 | 8/1996 | Amini et al. | 395/842 |
| 5,553,248 | 9/1996 | Melo et al. | 395/296 |
| 5,611,058 | 3/1997 | Moore et al. | 395/309 |
| 5,638,531 | 6/1997 | Crump et al. | 395/450 |
| 5,649,161 | 7/1997 | Andrade et al. | 711/167 |

FOREIGN PATENT DOCUMENTS

| | | |
|---|---|---|
| 0339224 | 11/1989 | European Pat. Off. . |
| 0535670 | 4/1993 | European Pat. Off. . |
| 2695227 | 3/1994 | France . |
| 9210495 | 3/1994 | France . |
| 2188759 | 10/1987 | United Kingdom . |

OTHER PUBLICATIONS

J. C. Kemp, "Instruction Translator", IBM Technical Disclosure Bulletin, XP 002046741 vol. 15, No. 3, pp. 920, Aug. 1972.

Patent Abstracts of Japan, "Semiconductor Memory Device", Inventor: Ito Yasuo, Aug. 19, 1986.

PCT Invitation to Pay Additional Fees with Communication Relating to the Results of the Partial International search, mailed Apr. 21, 1997, for counterpart PCT Application No. PCT/US96/16835.

(List continued on next page.)

*Primary Examiner*—John W. Cabeca
*Assistant Examiner*—Nasser Moazzami
*Attorney, Agent, or Firm*—Blakely, Sokoloff, Taylor & Zafman LLP

[57] ABSTRACT

A system and method for performing data transfers within a computer system is provided. The system includes a controller configured to dynamically adjust the interleave of the communications required to perform a series of data transfer operations to maximize utilization of the channel over which the communications are to be performed. The controller is able to vary the time interval between the transmission of control information that requests a data transfer and the performance of the data transfer by signaling the beginning of the data transfer with a strobe signal sent separate from the control information. The controller is able to defer the determination of how much data will be transferred in the operation by initiating the termination of a data transfer with a termination signal. The method provides a technique for distinguishing between identical control signals that are carried on the same line. The system includes a memory device with control circuitry that allows no more than one memory bank powered by any given power supply line to perform sense or precharge operations.

14 Claims, 21 Drawing Sheets

OTHER PUBLICATIONS

Steven A. Przybylski, "New DRAM Technologies, A Comprehensive Analysis of the New Architectures," pp. iii–iv, 119–21, 138–58, 177–203 (MicroDesign Resource 1994).

TMS626402, "2097 152–Word By 2–Bank Synchronous Dynamic Random–Access Memory," Texas Instruments, 1994, pp. 5–3–5–23.

"Architectural Overview," Rambus, Inc., 1992, pp. 1–24.

"MT4LC4M4E9 (S) 4 MEG X 4 DRAM," Micron Semiconductor, Inc., 1994, pp. 1–183–1–196.

"M5M4V16807ATP–10, –12, –15, Target Spec. (Rev. 0.3)," Mitsubishi Electric, May 7, 1993, pp. 1–36.

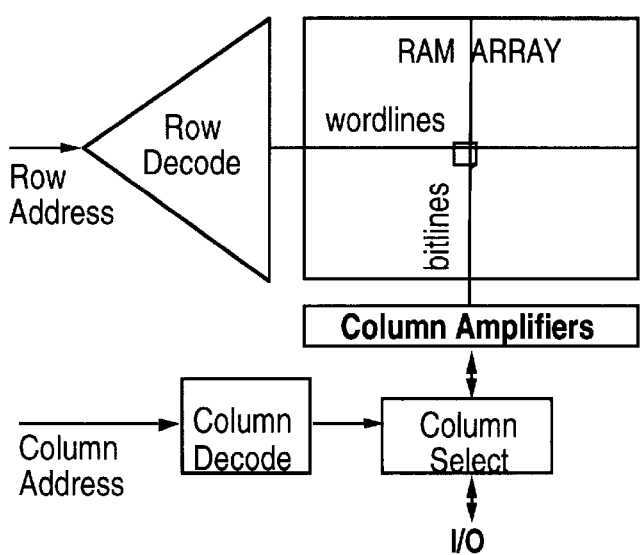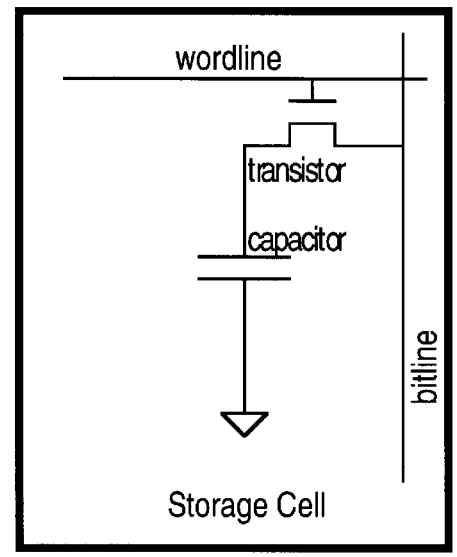
Fig. 1A
(Prior Art)
Fig. 1B
(Prior Art)

| Clock Cycle | Bus-Enable | Bus-Ctrl | BusData | | | | | | | | |
|---|---|---|---|---|---|---|---|---|---|---|---|
| | | | [8] | [7] | [6] | [5] | [4] | [3] | [2] | [1] | [0] |
| 0E | N | START | Op[0] ~510 | | | Adr [9:2] 502 | | | | | |
| 0O | N | Op 514 | Op[3] ~512 | | | Adr [17:10] 504 | | | | | |
| 1E | N | OpX[1] | ~516 | | | Adr [26:18] 506 | | | | | |
| 1O | N | Op[2] | ~518 520 | | | Adr [35:27] 508 | | | | | |
| 2E | N | OpX[0] | U | U | Count [6,4,2] 522 | | | U | U | U | U |
| 2O | N | U | U | U | Count [7,5,3] 524 | | | Count [1:0] 528 | | Adr [1:0] 501 | |

| Op[3]-Bcst | Op[2]-NoByteM | Op[1]-Reg | Op[0]-Write | ReadOp | WriteOp | RegOp | ReadRegOp Rreg | WriteRegOp Wreg | WregB | ACTION |
|---|---|---|---|---|---|---|---|---|---|---|
| 0 | 0 | 0 | 0 | | | | | | | ILLEGAL |
| 0 | 0 | 0 | 1 | | x | | | | | MEMORY WRITE DIRECTED BYTE MASK |
| 0 | 0 | 1 | 0 | | | | | | | ILLEGAL |
| 0 | 0 | 1 | 1 | | | | | | | ILLEGAL |
| 0 | 1 | 0 | 0 | x | | | | | | MEMORY READ DIRECTED |
| 0 | 1 | 0 | 1 | | x | | | | | MEMORY WRITE DIRECTED |
| 0 | 1 | 1 | 0 | | | x | x | | | REGISTER READ DIRECTED |
| 0 | 1 | 1 | 1 | | x | x | | x | | REGISTER WRITE DIRECTED |
| 1 | 0 | 0 | 0 | | | | | | | ILLEGAL |
| 1 | 0 | 0 | 1 | | x | | | | | MEMORY WRITE BROADCAST BYTE MASK |
| 1 | 0 | 1 | 0 | | | | | | | ILLEGAL |
| 1 | 0 | 1 | 1 | | | | | | | ILLEGAL |
| 1 | 1 | 0 | 0 | | | | | | | ILLEGAL |
| 1 | 1 | 0 | 1 | | x | | | | | MEMORY WRITE BROADCAST |
| 1 | 1 | 1 | 0 | | | | | | | ILLEGAL |
| 1 | 1 | 1 | 1 | | x | x | | | x | REGISTER WRITE BROADCAST |

Fig. 16B

| ACTION | MemOp | ReadMemOp | ReadMemDirectedOp | WriteMemOp | WriteMemNoByteMaskOp | WriteMemNoByteMaskDirectedOp | WriteMemNoByteMaskBroadcastOp | WriteMemByteMaskOp | WriteMemByteMaskDirectedOp | WriteMemByteMaskBroadcastOp | RsrvOp | BroadcastOp |
|---|---|---|---|---|---|---|---|---|---|---|---|---|
| ILLEGAL | | | | | | | | | | | | |
| MEMORY WRITE DIRECTED BYTE MASK | X | | | X | | | | X | X | | | |
| ILLEGAL | | | | | | | | | | | | |
| ILLEGAL | | | | | | | | | | | | |
| MEMORY READ DIRECTED | X | X | X | | | | | | | | | |
| MEMORY WRITE DIRECTED | X | | | X | X | X | | | | | | |
| REGISTER READ DIRECTED | | | | | | | | | | | | |
| REGISTER WRITE DIRECTED | | | | | | | | | | | X | |
| ILLEGAL | | | | | | | | | | | | |
| MEMORY WRITE BROADCAST BYTE MASK | X | | | X | | | | X | | X | | |
| ILLEGAL | | | | | | | | | | | | |
| ILLEGAL | | | | | | | | | | | | |
| ILLEGAL | | | | | | | | | | | | |
| MEMORY WRITE BROADCAST | X | | | X | X | | X | | | | | X |
| ILLEGAL | | | | | | | | | | | | |
| REGISTER WRITE BROADCAST | | | | | | | | | | | | X |

| OPEN | CLOSE | CURRENT BANK STATE | NEW BANK STATE | ACTION |
|---|---|---|---|---|
| 0 | 0 | CLOSED | CLOSED | ILLEGAL |
| 0 | 1 | CLOSED | CLOSED | NO ACTION |
| 1 | 0 | CLOSED | OPEN | SENSE-CARD |
| 1 | 1 | CLOSED | CLOSED | SENSE-COMMAND-PRECHARGE |
| 0 | 0 | OPEN | OPEN | COMMAND |
| 0 | 1 | OPEN | CLOSED | COMMAND-PRECHARGE |
| 1 | 0 | OPEN | OPEN | PRECHARGE-SENSE-COMMAND |
| 1 | 1 | OPEN | CLOSED | PRECHARGE-SENSE-COMMAND-PRECHARGE |

Fig. 19

PROTOCOL FOR COMMUNICATION WITH DYNAMIC MEMORY

This is a divisional of application Ser. No. 08/545,292, filed Oct. 19, 1995, now U.S. Pat. No. 5,748,914.

FIELD OF THE INVENTION

The present invention relates to dynamic random access memory (DRAM), and more specifically, to a method and apparatus for controlling data transfers to and from a dynamic random access memory.

BACKGROUND OF THE INVENTION

Dynamic random access memory (DRAM) components, such as those illustrated in FIG. 1A, provide an inexpensive solid-state storage technology for today's computer systems. Digital information is maintained in the form of a charge stored on a two-dimensional array of capacitors. One such capacitor is illustrated in FIG. 1B.

FIG. 2 illustrates a prior art memory system including DRAM with the corresponding control, address and data wires which connect the DRAM to the processor or memory controller component. In synchronous DRAMs, a write access is initiated by transmitting a row address on the address wires and by transmitting row address strobe (RAS) signal. This causes the desired row to be sensed and loaded by the column amplifiers. The column address is transmitted on the address wires and the column address strobe (CAS) signal is transmitted along with the first word of the write data WData(a,1). The data word is then received by the DRAM and written into the column amplifiers at the specified column address. This step can be repeated "n" times in the currently loaded row before a new row is sensed and loaded. Before a new row is sensed, the old row must be restored back to the memory core and the bit lines of the DRAM precharged.

FIG. 3A illustrates synchronous write timing. In the figure, a, b . . . represent a row address; 1, 2 . . . n represent a column address, WData [row, col] represents the DRAM address of data words, the row address strobe (RAS) is a control signal for initiating a sense operation, and WRITE (CAS) initiates the write operation on the column amplifiers. In the present example, the row column address delay timing parameter is equal to two clock cycles. After the row address is asserted at the first clock cycle, column addresses and write data are asserted after the delay to write the data into the DRAM array.

FIG. 3B illustrates synchronous read timing. A processor initiates a read access by transmitting a row address on the address wires and by transmitting the row address strobe (RAS) signal. This causes the desired row to be sensed by the column amplifiers. The column address is then transmitted on the address wire and the column address strobe (CAS) signal is transmitted. The first word of the read data RData (a,1) is then transmitted by the DRAM and received by the processor. This step can be repeated "n" times in the currently loaded row before a new row is sensed and loaded. Before a new row is sensed, the old row must be restored back to the memory array.

Various attempts have been made to improve the performance of conventional DRAMs. Such attempts have resulted in DRAM architectures that deviate in varying degrees from conventional DRAM architectures. Various alternative DRAM architectures are described in detail in NEW DRAM TECHNOLOGIES, by Steven A. Przybylski, published by MicroDesign Resources, Sebastopol, Calif. (1994). Some of those architectures are generally described below.

EXTENDED DATA-OUT DRAMS

The prior art includes Extended Data-Out (EDO) memory systems. In EDO DRAMs, the output buffer is controlled by signals applied to output enable (OE) and column address stobe (CAS) control lines. In general, data remains valid at the output of an EDO DRAM longer than it does for conventional DRAMs. Because the data remains valid longer, the transfer of the data to the latch in the memory controller can be overlapped with the next column precharge. As a result, burst transfers can be performed in fewer clock cycles.

SYNCHRONOUS DRAMS

The prior art also includes Synchronous DRAM (SDRAM) memory systems. The interface of an SDRAM includes a multiplexed address bus and a high-speed clock. The high speed clock is used to synchronize the flow of addresses, data, and control on and off the DRAM, and to facilitate pipelining of operations. All address, data and control inputs are latched on the rising edge of the clock. Outputs change after the rising edge of the clock. SDRAMs typically contain a mode register. The mode register may be loaded with values which control certain operational parameters. For example, the mode register may contain a burst length value, a burst type value, and a latency mode value. The burst length value determines the length of the data bursts that the DRAM will perform. The burst type value determines the ordering of the data sent in the bursts. Typical burst orders include sequential and sub-block ordered. The latency mode value determines the number of clock cycles between a column address and the data appearing on the data bus. The appropriate value for this time interval depends largely on the operating frequency of the SDRAM. Since the SDRAM cannot detect the operating frequency, the latency mode value is programmable by a user.

REQUEST ORIENTED DRAM SYSTEMS

The prior art also includes memory systems in which data transfer operations are performed by DRAMs in response to transfer requests issued to the DRAMs by a controller. Referring to FIG. 4, it illustrates a memory system in which data transfers are made in response to transfer requests. The request packet format is designed for use on a high speed multiplexed bus for communicating between master devices, such as processors, and slave devices, such as memories. The bus carries substantially all address, data, and control information needed by the master devices for communication with the slave devices coupled to the bus. The bus architecture includes the following signal transmission lines: BusCtl, BusData [8:0], BusEnable, as well as clock signal lines and power and ground lines. These lines are connected in parallel to each device.

The processors communicate with the DRAMs to read and write data to the memory. The processors form request packets which are communicated to the DRAMs by transmitting the bits on predetermined transmission lines at a predetermined time sequence (i.e. at predetermined clock cycles). The bus interface of the DRAM receiver processes the information received to determine the type of memory request and the number of bytes of the operation. The DRAMs then perform the memory operation indicated by the request packet.

FIG. 5 illustrates command control information 500 that is sent in a data transfer request according to a prior art protocol. In the illustrated example, the command control information 500 is sent over a BusCtl line and a nine-bit data bus (BusData[8:0]) in six clock cycles. The command control information 500 includes groups of bits 501, 502, 504, 506 and 508 that constitute an address, an operation code consisting of six bits 510, 512, 514, 516, 518 and 520, and groups of bits 522, 524 and 528 that specify a count. The address identified in the command control information 500 specifies the target DRAM and the beginning location within the DRAM of the data on which the operation is to be performed. The count identified in the command control information 500 specifies the amount of information on which the operation is to be performed.

SUMMARY AND OBJECTS OF THE INVENTION

One object of the present invention is to provide a mechanism to decouple control timing from data timing.

Another object of the present invention is to provide mechanisms that use minimal bandwidth to determine data timing while minimizing the latency from signaling that the data transfer should terminate to the transmission of the final data packet.

Another object of the present invention is to provide mechanisms for arbitrarily long data transfers following a command. This may include simultaneous provision of a new column address for each data packet transferred.

Another object of the present invention is to provide a means to signal simultaneously with termination of the data transfer that a precharge operation should be performed.

Another object of the present invention is to provide mechanisms and methods for interleaving control and data information in such a fashion that pin utilization is maximized without placing latency requirements upon the DRAM core that are difficult or expensive to satisfy.

Another object of the present invention is to provide a mechanism for interleaving control and data information that minimizes bandwidth consumed for signaling the beginning and ending of data transfers.

Another object of the present invention is to provide for devices that do not always interpret the information presented at their pins. Each command provides sufficient information that all further control information related to the command can be easily determined even in the presence of control information related to previous command transfers.

Another object of the present invention is to provide a mechanism for optionally sequencing a series of core operations prior to data transmission and, optionally, a final core operation after data transmission is terminated.

Another object of the present invention is to provide a DRAM core which allows a single high current RAS operation at any one time in order to minimize the cost and complexity of the DRAM.

Another object of the present invention is to provide an encoding of the command such that decoding space and time is minimized and functionality is maximized.

The present invention provides a method and apparatus for performing data transfers within a computer system. The method includes causing a controller to transmit control information on a bus. The control information specifies a data transfer operation and a beginning location of data to be transferred. The controller determines, after transmitting the control information on the bus, a desired amount of data to be transferred in the data transfer operation. The controller transmits over the bus a terminate indication at a time that is based on the desired amount of data and a beginning time of the data transfer operation. A memory device reads the control information on the bus. The memory device performs the specified data transfer operation on data stored at the beginning location. The memory device continues to perform the specified data transfer operation until detecting the terminate indication on the bus. The memory device ceases to perform the data transfer operation at a time that is based on the time at which the terminate indication is detected.

Other objects, features, and advantages of the present invention will be apparent from the accompanying drawings and from the detailed description that follows below.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1A is a block diagram of prior art dynamic random access memory (DRAM) component;

FIG. 1B illustrates a storage cell of the DRAM shown in FIG. 1A;

FIG. 5 illustrates command control information that is sent from a controller to a DRAM according to a prior art protocol;

FIG. 16A illustrates an operation code encoding scheme according to an embodiment of the invention;

FIG. 16B is a continuation of the table illustrated in FIG. 16A;

FIG. 19 illustrates a mapping between Open and Close bits and the operations that are performed by a DRAM in response to the bits according to an embodiment of the invention;

DETAILED DESCRIPTION

Figure 2:
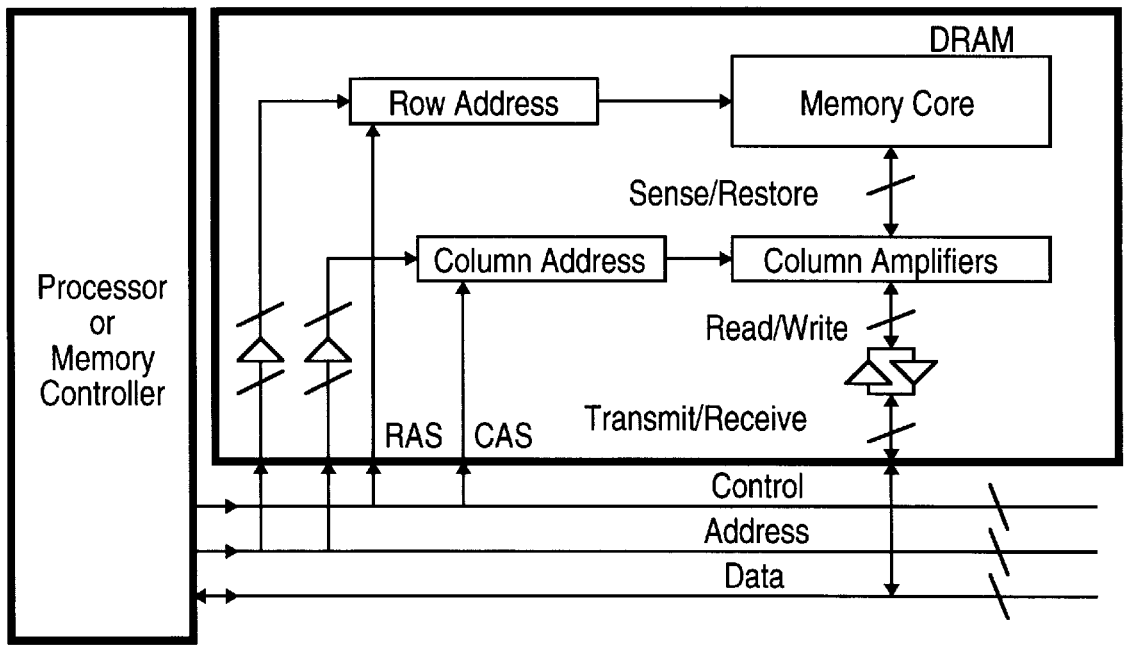
FIG. 2 is a block diagram illustrating a DRAM system and input/output pins and signal lines for accessing the DRAM.
Figure 3A:
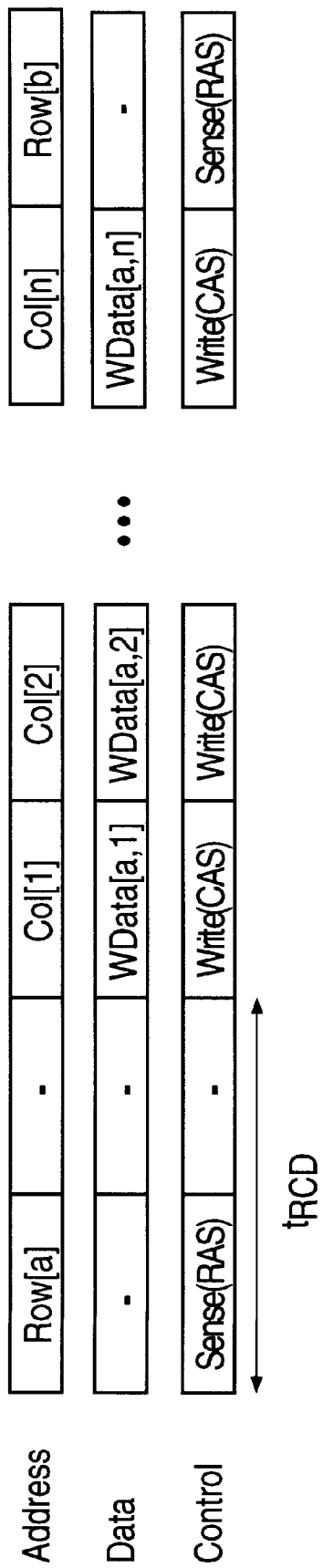
FIG. 3A is a timing diagram illustrating synchronous write timing.
Figure 3B:
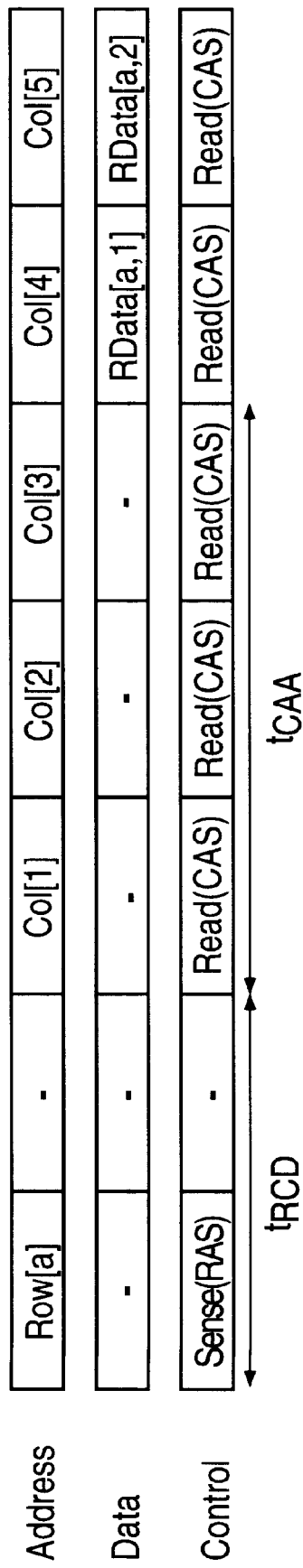
FIG. 3B is a prior art timing diagram illustrating synchronous read timing.
Figure 4:
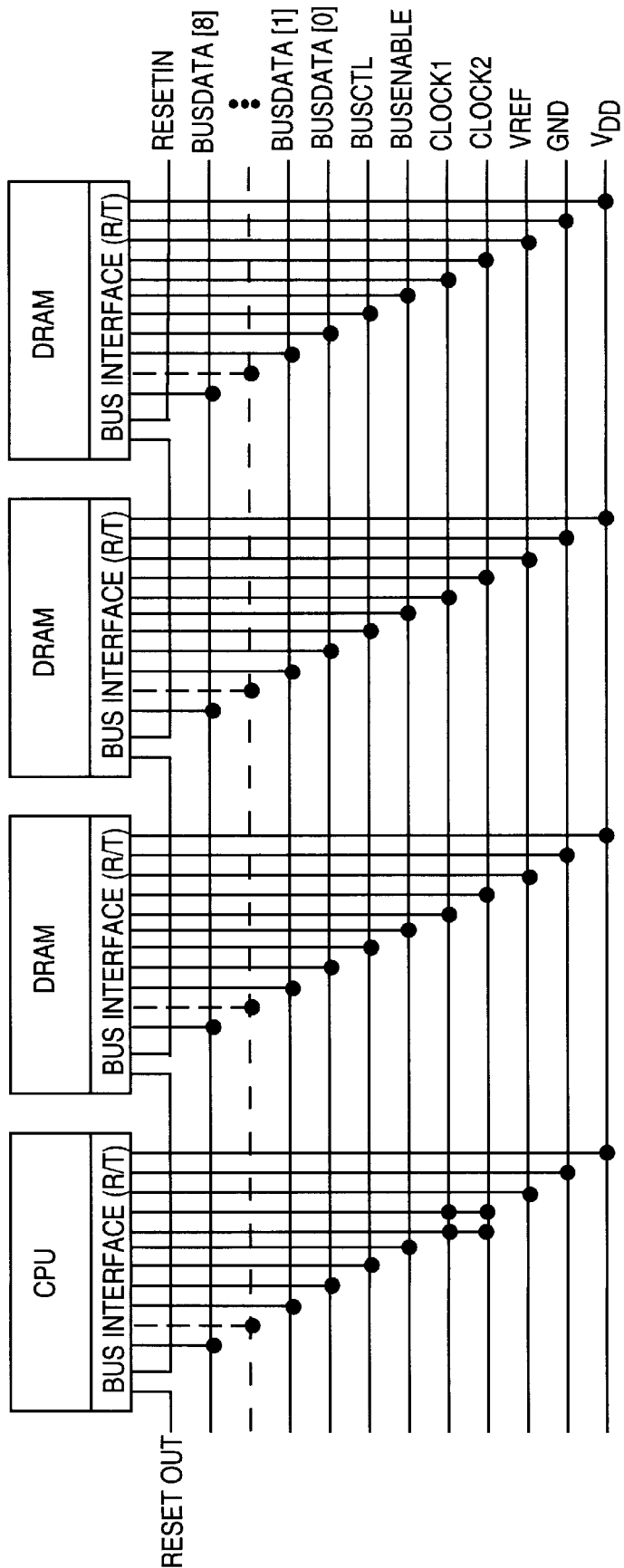
FIG. 4 is a prior art memory system in which a memory controller issues request packets to DRAM over a channel.
Figure 6:
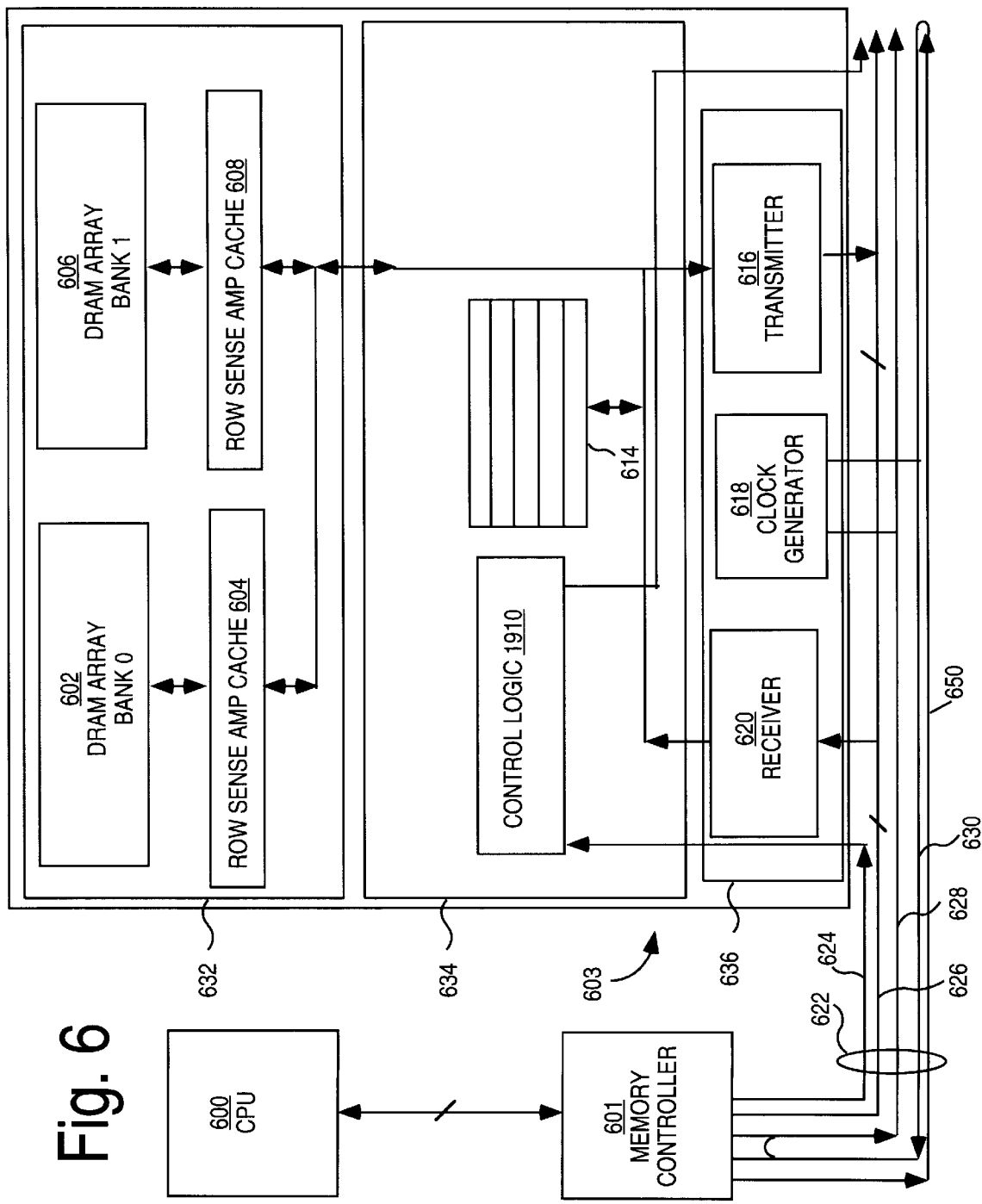
FIG. 6 is a block diagram of a computing system that includes the present invention.

FIG. 6 is a block diagram of a computing system that includes the present invention. The data transport system includes a central processing unit 600, a memory controller 601 and a DRAM 603. The memory controller 601 connects the CPU 600 to a channel 622 to which DRAM 603 is connected. For the purposes of explanation, a single DRAM is shown on channel 622. However, the present invention is not limited to any particular number of DRAMs on the channel 622.

The CPU 600 may be, for example, a microprocessor. When the CPU 600 executes instructions that require a data transfer operation, the CPU 600 transmits control signals specifying the desired transfer operations to memory controller 601. Memory controller 601 may be, for example, an application specific integrated circuit (ASIC) memory controller configured to transmit request packets to DRAM 603 over channel 622 to specify the desired transfer operation.

According to one embodiment, channel 622 includes a line 624 for initializing daisy chain input, a "clock to end" line 650, a "clock from master" line 628, a "clock to master" line 630, and a plurality of lines 626 that includes a BusEnable line, a BusCtl line and a nine-bit data bus (BusData[8:0]). The "clock to end" line 650 carries a clock signal from memory controller 601 to the end of line 630. The "clock to master" line 630 routes the clock signal to the various devices on channel 622 and back to memory controller 601. The "clock from master" line 628 routes the clock signal from the "clock to master" line 630 back to the various devices on channel 622. The clock signal on the "clock from master" line 628 is aligned with request and write data packets transmitted by controller 601. The clock signal on the "clock to master" line 630 is aligned with read data packets transmitted by DRAM 603. The information communicated over lines 626 includes request packets, data transfer control signals, and data packets.

DRAM 603 is divided into three sections: an storage section 632, a control section 634, and a I/O section 636. The storage section 632 includes a DRAM core consisting of two independent memory banks 602 and 606. It should be noted that a two-bank DRAM shall be described simply for the purposes of explanation. The present invention is not limited to DRAMs with any particular number of memory banks.

Each of the memory banks 602 and 606 has a latching sense amplifier cache 604 and 608. The caches 604 and 608 hold the currently sensed row of their respective memory banks. The control section 634 includes control logic 610 and control registers 614. Control logic 610 performs initialization operations in response to control signals on line 624. Control registers 614 are read and written to using special register space commands. The contents of the control registers 614 determine how DRAM 603 operates. For example, the control registers 614 may store values that determine the output drive current used by DRAM 603, the base address of DRAM 603 and the configuration and size of DRAM 603.

The I/O section 636 includes a clock generator 618, a receiver 620, and a transmitter 616. The clock generator 618 uses the external clock signals to create clock signals used internally by DRAM 603. The receiver 620 and transmitter 616 contain multiplexing and storage hardware to permit internal data paths to operate at a slower clock rate, but equivalent bandwidth, to lines 626.

Figure 7:
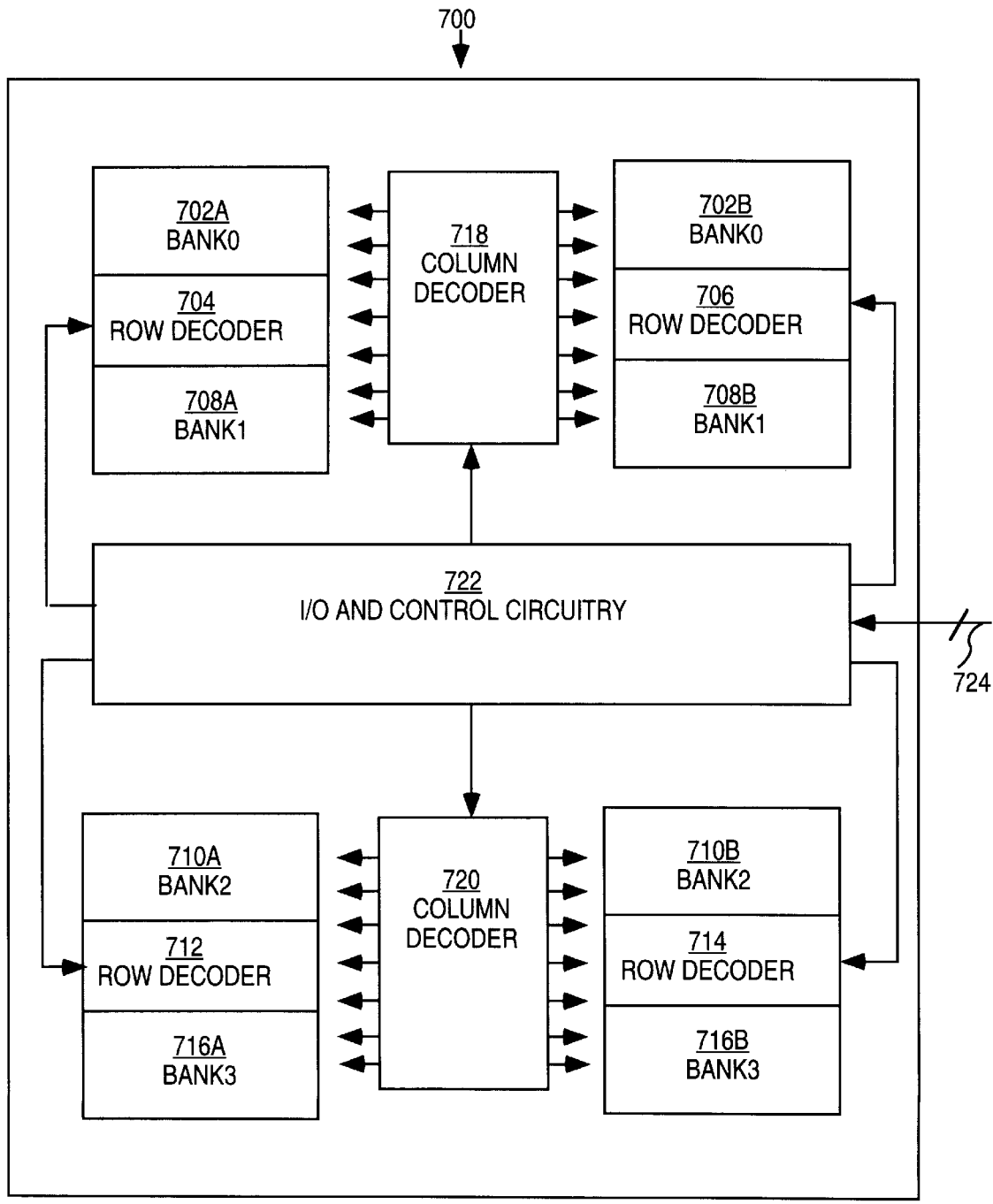
FIG. 7 is a block diagram the illustrates the control and decode circuitry of a DRAM according to one embodiment of the invention.

FIG. 7 is a block diagram of a DRAM in which the present invention may be implemented according to one embodiment of the invention. Referring to FIG. 7, a DRAM 700 generally includes I/O and control circuitry 722, four banks of memory, a plurality of column decoders 718 and 720, and a plurality of row decoders 704, 706, 712 and 714. Each of the four banks are split into two memory blocks. Specifically, BANK0 is distributed over blocks 702A and 702B, BANK1 is distributed over blocks 708A and 708B, BANK2 is distributed over blocks 710A and 710B and BANK3 is distributed over blocks 716A and 716B.

I/O and control circuitry 722 receives request packets from a controller over a channel 724. The request packets include an address that corresponds to a storage location and an operation code that specifies the operation to be performed on the data stored in the specified storage location. To perform a read operation, I/O and control circuitry 722 transmits control signals to the row decoders 704, 706, 712 and 714 to cause the row that contains the specified data to be moved into a cache. Then the I/O and control circuitry 722 transmits control signals to the column decoders 718 and 720 to cause the data from a column of the row in the row cache to be transmitted out onto the channel 724. The column that is transmitted is the column that corresponds to the address contained in the request packet.

CONTROLLER OPERATION

Figure 8:
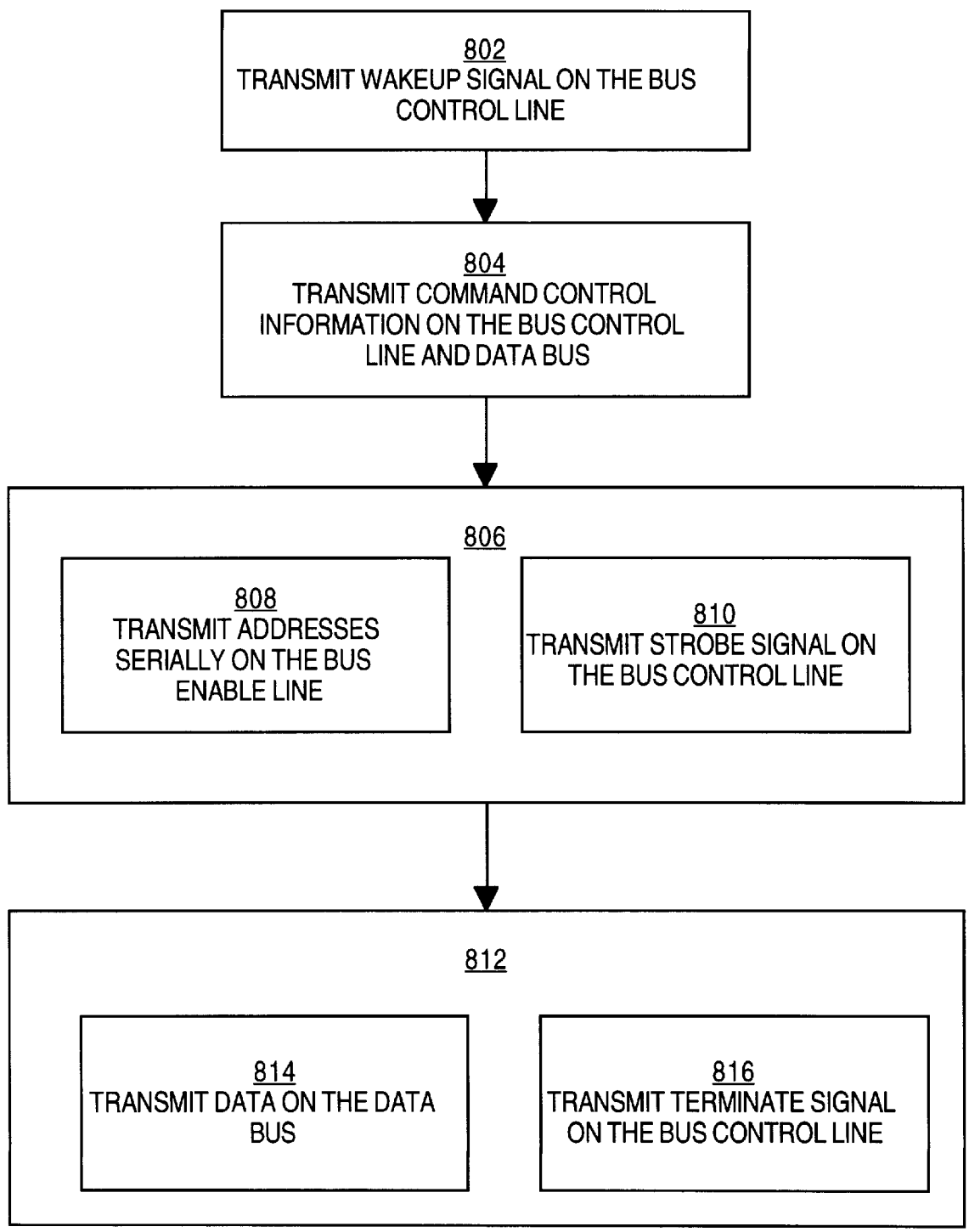
FIG. 8 is a flow chart illustrating the protocol employed by a controller to initiate data transfers according to an embodiment of the present invention.

Referring to FIG. 8, it is a flow chart that illustrates the protocol employed by a controller to initiate data transfers according to one embodiment of the invention. At step 802, the controller transmits a wakeup signal to the DRAM that will be involved in the data transfer operation (the "target DRAM"). At step 804, the controller transmits command control information to the target DRAM. The contents of the command control information according to one embodiment of the invention are illustrated in FIG. 9.

Figure 9:
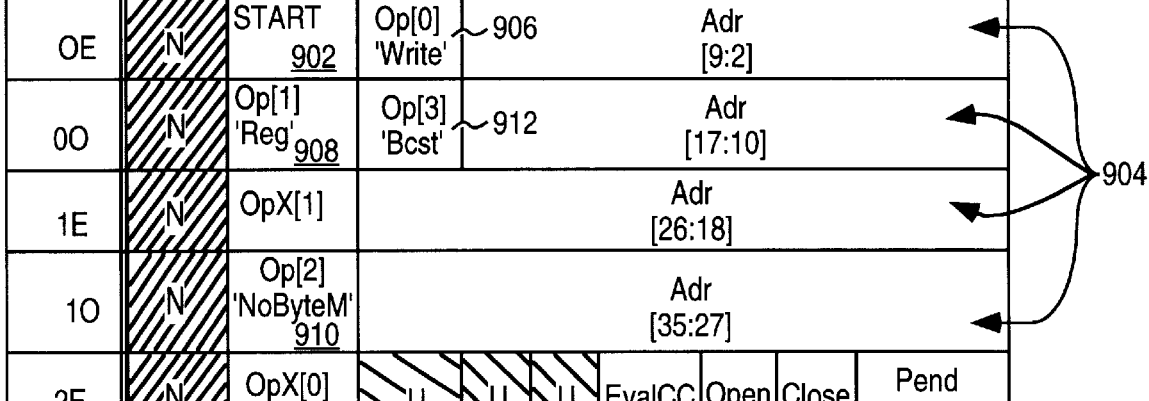
FIG. 9 illustrates a request packet according to one embodiment of the present invention.

Referring to FIG. 9, the command control information is transmitted over the BusCtl line and BusData[8:0] lines over three clock cycles, where each clock cycle has even and odd phases. A start bit 902 is sent over the BusCtl line on the even phase of the first clock cycle. As shall be described in greater detail below, the start bit serves as a flag which allows the DRAM to identify the signals as command control information.

The command control information includes an address 904 that identifies the beginning memory location in the target DRAM that will be involved in the specified data transfer operation. The command control information further includes an operation code, open and close bits, and a Pend value.

As shall be explained below, certain bits in the operation code directly correspond to control lines within the target DRAM. Specifically, the operation code includes a Write bit 906, a Reg bit 908 and a NoByteM bit 910 that correspond to control lines in the target DRAM. Upon receipt of the command control information, the DRAM simply places the value stored in these bits on the respective control line. The operation code also contains a broadcast bit 912 to indicate whether the specified operation is a broadcast operation.

The Open, Close and Pend values serve functions described in greater detail below. In general, the Open and Close bits specify whether precharge and/or sense operations are to be performed before and/or after the operation specified in the operation code. The Pend value indicates how many odd phase bits will appear on the BusCtl line after the command control information and before the strobe signal that corresponds to the operation specified in the command control information (other than any odd phase bits in request packets for other transactions). The command control information also contains other values "EvalCC" and "Mask" that do not relate to the present invention.

Referring again to FIG. 8, control passes from step 804 to step 806. During step 806, the controller transmits the strobe signal over the BusCtl line (step 810). If the transaction involves more than one data packet, then the column address for data packets that are to be sent subsequent to the first data packet are transmitted serially over the BusEnable line (step 808). Steps 808 and 810 are combined in step 806 to indicate that step 810 is performed concurrently with step 808. In one embodiment, the transmission of the address for subsequent data packets begins at a sufficient interval prior to the time at which those data packets are to be sent to allow the second and subsequent data packets to be sent after the first data packet without interruption.

At step 814, the data is transmitted over the data bus (BusData[8:0]). During this step, the data may be transmitted to or from the target DRAM, depending on whether the data transfer operation is write or read operation. At some fixed period of time prior to the transmission of the last the last data packet, the controller transmits the terminate signal on the BusCtl line (step 816). Steps 816 and 814 are shown as a single step 812 to indicate that step 816 is performed during the performance of step 814.

As shall be explained below, one embodiment of the memory controller dynamically adjusts the interleave of data and control information to more fully utilize the channel. Interleave refers to the relative ordering of data, requests and control signals that are associated to multiple transactions. To allow dynamic interleave adjustment, there is no fixed time period between the execution of steps 804 and 806. Rather, the controller is free to adjust the timing of step 806 relative to the timing of step 804 as needed to provide the desired interleave (e.g., to provide time to transmit the command control information for other transactions between execution of steps 804 and 806).

In one embodiment, the controller is configured to limit the number of requests that are targeted to any given DRAM. For example, if two data transfer operations have been requested for a given DRAM, the controller will refrain from issuing a third request until one of the outstanding requests has been serviced. By limiting the number of requests any DRAM must handle at any given time, the size of the command queue within the DRAM may be reduced, decreasing the complexity of the DRAM.

In one embodiment, the number of outstanding requests on the channel may be larger than the number of requests being processed by any single DRAM. Preferably, the number of outstanding requests is limited only by the size of the field which indicates the number of outstanding requests, and the aggregate number of requests which can be handled by all of the DRAMs on the channel.

DEFERRED TRANSFER SIZE DETERMINATION

In typical EDO and SDRAM components, only a finite number of data transfer sizes are supported. For each data transfer size, there is a fixed ratio between the amount of control information that must be sent to a DRAM and the amount of data to be transferred in the operation. Thus, the larger the amount of data to be transferred, the larger the amount of control information that must be sent to the DRAM. For example, with an SDRAM that only supports transfers of one or four data words, two four-word transfers must be performed to transfer eight data words. Thus, all of the control information that a controller must send to the DRAM for a four data word transfer, including an operation code and an address, must be sent twice.

In prior art request-oriented systems, a data transfer count is part of the command control information that a controller sends to a DRAM to initiate a data transfer operation. The amount of bits allocated in the control information for sending the data transfer count is fixed. Consequently, the size of data transfers that a system may perform in response to a single transfer request is limited to the number of data packets that can be specified in the available number of bits. The size limit thus placed on data transfers makes it necessary for transfers of large amounts of data to be performed using numerous requests for smaller data transfer operations. For example, if the data transfer count is only five bits long and data packets are eight bytes, then the maximum size of a data transfer is 256 bytes (32 data packets). For transfers larger than 256 bytes, more than one request packet must be used.

In one prior art request-oriented system, the controller is allowed to prematurely terminate a data transfer operation by transmitting a terminate control signal to the DRAM. Upon receipt of the terminate control signal during a particular data transfer operation, the DRAM ceases to process data for the operation, even if the amount of data that has been transferred is less than the amount of data that was specified in the data transfer count of the operation. This technique allows the controller to shorten data transfers after a particular transfer size has been specified, but does not overcome the limitations associated with having a maximum size limit per requested transaction.

According to one aspect of the present invention, the command control information within a request packet no longer contains size information. Rather, the DRAM is configured to start and end the transmission of data based on data transfer control information sent by the controller to the DRAM separate from and subsequent to the transmission of the command control information. According to one embodiment, the data transfer control information includes data transfer start information (a "strobe signal") sent from the controller to indicate when the DRAM is to begin sending data, and data transfer end information (a "terminate signal") to indicate when the DRAM is to stop sending data. The number of clock cycles that elapse between the transmission of the strobe signal and the terminate signal indicates the size of the data transfer.

If a data transfer operation involves more than one data packet, then the controller serially transmits column address information on the BusEnable line to specify the columns that contain the data to be sent in the second and subsequent data packets. Preferably, the controller begins to transmit the column address information at a time that allows the DRAM to have sufficient time to reconstruct the column addresses and prefetch the data from the specified columns in the DRAM core before the data packets that correspond to the column addresses are to be transmitted over the channel. Because the DRAM continuously receives column addresses over the BusEnable line during multi-packet transfers, the DRAM itself does not have to maintain a counter to determine from where to retrieve data for the next data packet.

By transmitting data transfer control information separate from the command control information, it is possible to specify a transfer operation for any amount of data. Thus, large transfers do not have to be broken up into multiple requests for smaller amounts of data. In one embodiment, the control circuitry within the DRAM is configured to begin retrieving requested data from the DRAM core as soon as possible after receipt of a request packet. The DRAM does not wait for the strobe signal to begin retrieving the data from the DRAM core. However, the DRAM does not transmit any data on the channel until the strobe signal is received. Because the initial data packet to be transmitted by the DRAM has been prefetched from the core, the data packet can be transmitted over the channel with minimal delay from when the strobe signal ultimately arrives.

There are numerous benefits to reducing the delay between the transmission of (1) a strobe signal for a transfer operation and (2) the first packet in the transfer operation. For example, the minimum latency between a transfer request and the beginning of the transfer can never be less than the strobe-to-data delay. Therefore, the strobe-to-data delay may determine the critical path for DRAMs that support fast core operations. In addition, the longer the strobe-to-data delay, the more complex the controller must be to accurately and efficiently pipeline the command control information and strobe signals.

The bandwidth required to indicate the start and end of a data transfer operation with single bit strobe and terminate signals is minimal. In one embodiment, a single line (the BusCtl line) is used to carry a variety of control signals, including the strobe and terminate signals. Further, the channel utilization employed to start and terminate a transfer operation does not vary with the size of the data to be transferred.

Due to intrinsic circuit delays, the DRAM does not instantly terminate data transmission upon the receipt of the terminate signal. Rather, the terminate signal causes the DRAM to initiate termination of the data transfer. Transmission of the last data packet in a transfer actually occurs on some clock cycle after the receipt of the terminate signal. When a terminate signal is used to specify the end of a transfer operation, it is important to minimize the latency between the transmission of the terminate signal for the transaction and the transmission of the last data packet of the transaction. By reducing the latency between the terminate signal for a transaction and the time at which the channel ceases to be used to send data for the transaction, the amount of time required for the controller to use the channel for another transaction is reduced. This is particularly important when there are multiple requesters that are contending for use of the same channel.

According to one embodiment, the terminate signal may be used to either end a transaction or suspend a transaction. The exact timing of the terminate signal may be used to indicate whether a transfer operation should be terminated or merely suspended. For example, if the terminate signal is sent at one modulus relative to the strobe signal, the DRAM is configured to terminate the data transfer operation. A modulus is the remainder obtained after dividing one integer by another integer. If the terminate signal is sent at a different modulus relative to the strobe signal, the DRAM is configured to suspend the transfer operation. The DRAM may be configured to continue transfer operations that have been suspended upon receipt of a continue control signal.

DECOUPLED DATA TRANSFER CONTROL INFORMATION

In prior art systems, the timing of a data transfer is dictated by the timing of the request for the data transfer. Thus, given that a transfer request arrived on a particular clock cycle, it was known that the data specified in the request would begin to appear on BusData[8:0] a predetermined number of clock cycles from the particular clock cycle. For example, the number of clock cycles that elapse between a request packet and the transfer of data specified in the request packet may be determined by a value stored in a register within the DRAM. This fact renders prior art systems inflexible with respect to how control and data signals may be interleaved to maximize the use of the channel.

As mentioned above, the data transfer control information which controls the timing of the data transfer associated with a request packet is sent separately from the command control information to which it corresponds. According to another aspect of the invention, the timing of the data transfer control information is variable relative to the timing of the corresponding request packet. That is, the number of clock cycles between the transmission of a request packet and the transmission of the strobe signal to begin the transfer specified in the request packet may vary from transaction to transaction.

According to an alternate embodiment of the invention, the amount of time that elapses between the transmission of a request packet and the transmission of the data specified in a request packet is varied without the use of strobe and terminate signals. In this embodiment, the request packet contains a delay value that indicates to the DRAM when the data specified in the request packet will begin to be sent relative to the time at which the request packet is sent. The DRAM would include a counter to count the clock cycles that elapse from the arrival of the request packet in order to send or receive the data specified in the request on the appropriate clock cycle. Because the controller may vary the latency between request packet and data transmission, the controller is able to dynamically adjust the operative interleave on the channel, as shall be described in greater detail below.

DYNAMIC INTERLEAVE ADJUSTMENT

As mentioned above, the fixed timing between requests and data transmissions renders prior art systems inflexible with respect to how control and data signals may be interleaved. For example, FIGS. 10 and 11 illustrate the timing of transactions for particular prior art protocol systems.

Figure 10:
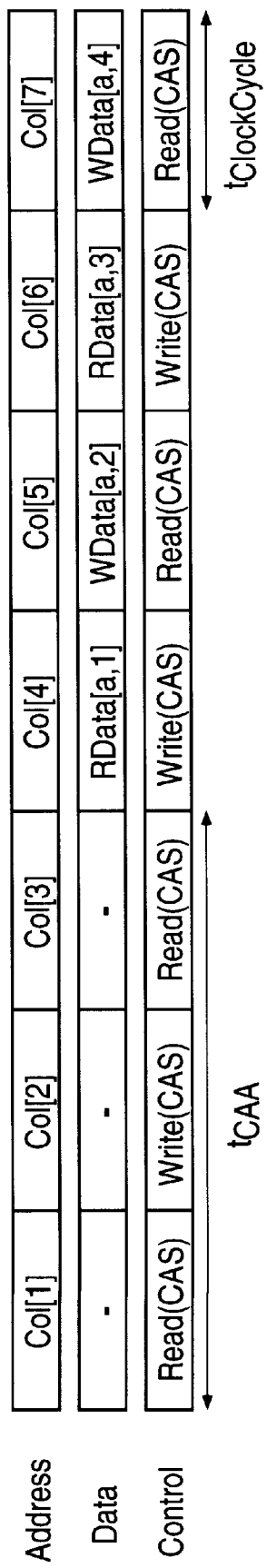
FIG. 10 is a timing diagram illustrating interleaved read/write transaction timing when the read latency equals the write latency according to a prior art protocol.
Figure 11:
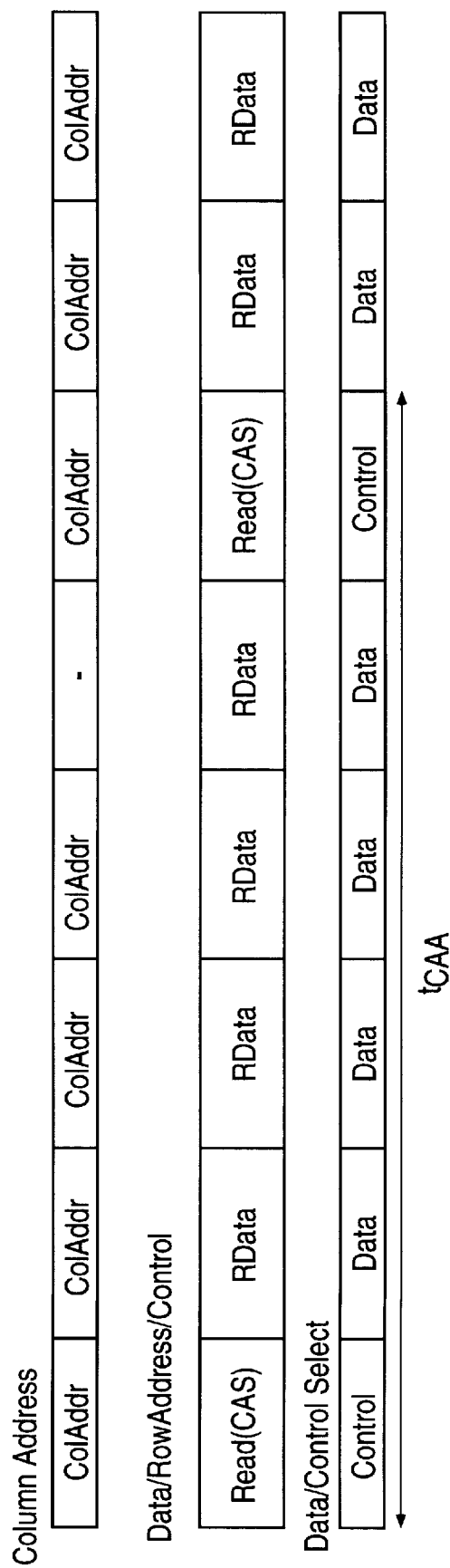
FIG. 11 is a timing diagram which illustrates synchronous interleaved read timing with multiplexed data/row/control information according to an alternative prior art protocol.

Referring to FIG. 10, it illustrates interleaved timing of read and write accesses. The interleave structure permits read accesses to a DRAM to be interleaved with write accesses to another DRAM. FIG. 11 illustrates synchronous interleaved read timing with multiplexed data/row/control information according to an alternative prior art protocol. Both of these prior art interleave patterns increase utilization of the channel and the internal resources of the DRAM relative to non-interleaved protocols. However, the timing between requests and data transfers is fixed, so the interleave patterns are fixed. Consequently, controllers cannot make interleave adjustments to maximize usage of the channel and DRAM resources in response to changing conditions in the system.

The ability to vary the timing between the transmission of a request packet and the transmission of the data specified in the command control information makes it possible to interleave the information on BusData[8:0] in variations that were not previously possible. According to one embodiment of the invention, controllers dynamically adjust the interleave to maximize the use of the channel in the face of internal DRAM latencies that are long with respect to the transmission of control information or data.

Figure 12:
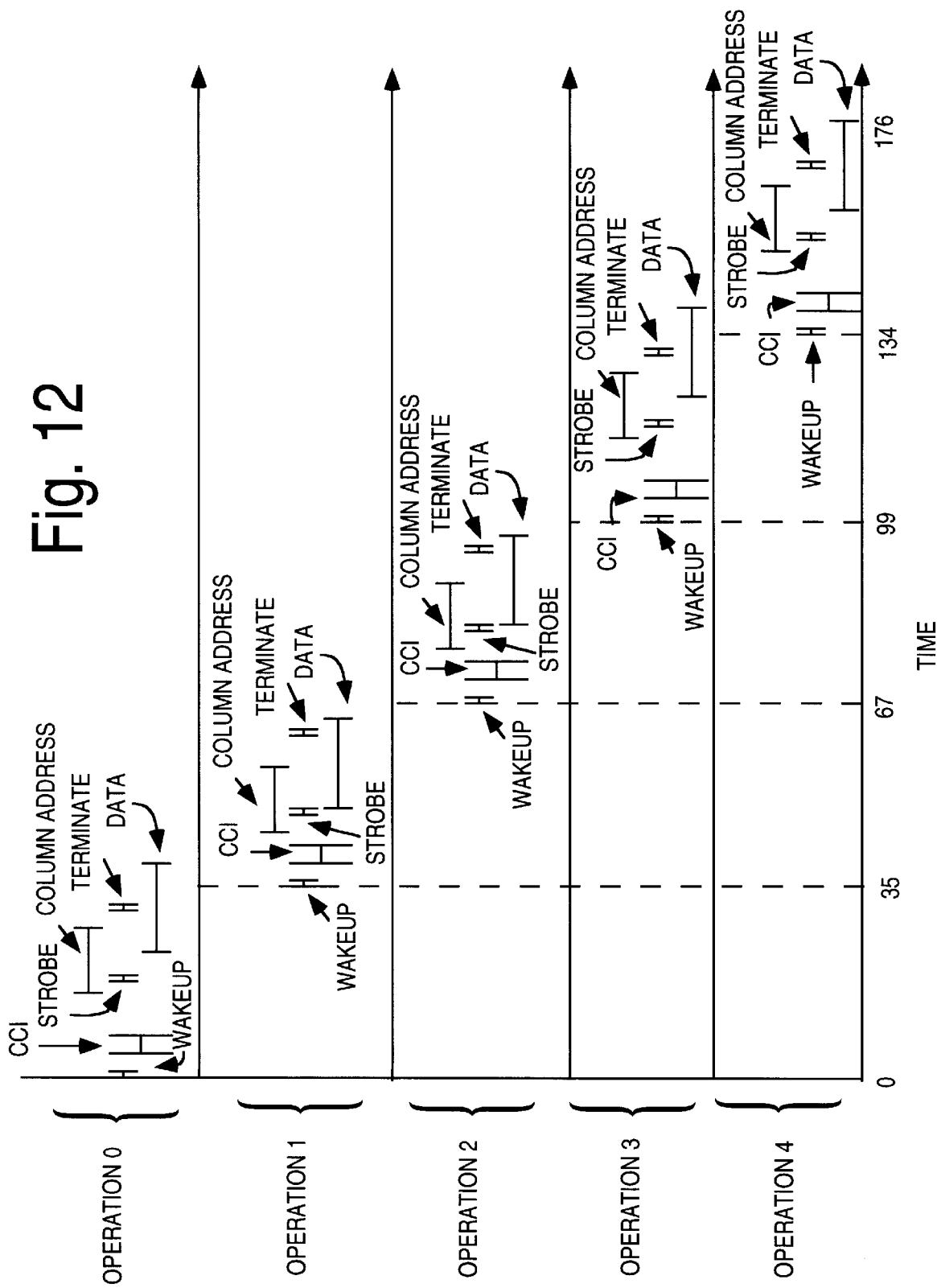
FIG. 12 illustrates the timing of five transactions performed in a non-interleaved embodiment of the present invention.

Referring to Appendix A and FIG. 12, they illustrate the timing of five non-interleaved data transfer operations. At clock cycle 0, a wakeup signal associated with transaction 0 is transmitted from the controller to the DRAM on the BusCtl line "BC". At clock cycles 4 through 6 the command control information for transaction 0 is sent from the controller to the DRAM over the BusCtl line and nine bus data lines "BD[8:0]". At clock cycle 10 the DRAM begins sensing the row specified in the command control information of the bank specified in the command control information. At clock cycle 17 the controller sends the strobe signal associated with transaction 0 to the DRAM. At clock cycle 23 the DRAM begins transferring data beginning at the address specified in the command control information. At clock cycle 30 the controller sends a terminate signal associated with transaction 0 to the DRAM. At clock cycle 38, the DRAM sends the last data associated with transaction 0.

The wakeup signal for transaction 1 is transmitted at clock cycle 35. At clock cycles 39 through 41 the command control information for transaction 1 is transmitted. The timing for transactions 1 through 4 proceeds as illustrated. This example clearly illustrates that there is minimal timing overlap between transactions when signals for different transactions are not interleaved. Consequently, bandwidth that may be used to begin subsequent transactions goes unused.

Figure 13:
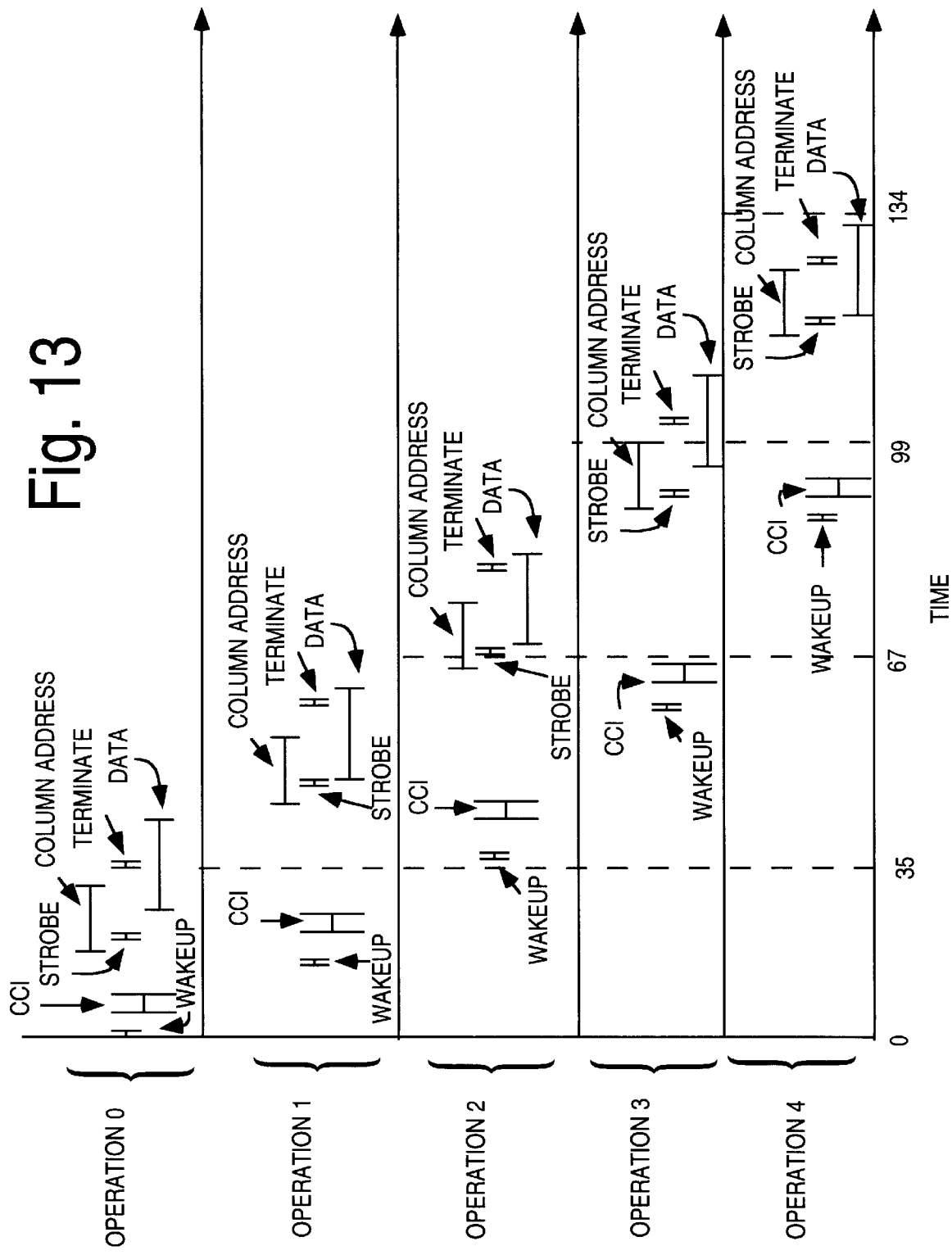
FIG. 13 illustrates the timing of five transactions performed in an interleaved embodiment of the present invention.

Referring to Appendix B and FIG. 13, they illustrate the timing of interleaved data transfer operations. In the illustrated example, the wakeup signal for transaction 1 is transmitted at clock cycle 20, even before data has started to be sent for transaction 0. By the time the terminate signal has been sent for transaction 0, the wakeup signal and command control information have been sent to the DRAM for transaction 1. The transmission of this information during the execution of transaction 0 does not result in any performance penalty because the bandwidth used to transfer the information was otherwise unused. Significantly, five transactions are completed by clock cycle 131 using the interleaved example shown in Appendix B, while completion of five transactions requires 172 clock cycles in the non-interleaved system shown in Appendix A.

The ability to dynamically adjust the interleave of control and data information allows controllers to increase the utilization of the channel. In addition, the controller can adapt the interleave to the changing demands being placed on the bus to minimize latency. For example, the controller can transition from a cold start, where the bus is idle, to an active state by issuing a series of requests back-to-back and then waiting for the data that will be sent in response to the requests. After start, the controller adjusts the interleave to shift from minimizing latency to maximizing utilization of the channel and internal resources of the DRAM. Therefore, after a steady state has been achieved, the controller avoids having too many back-to-back requests. Rather, the controller switches to a smoother interleave pattern, such as the pattern illustrated in Appendix B. An exemplary series of transactions that illustrate how a controller that employs the protocol of the present invention is able to dynamically change the interleave of transactions shall be discussed in greater detail below with reference to Appendix C.

SIGNAL OVERLOAD

To help maximize utilization of the channel, the same control line may be used to carry numerous control signals. For example, in the protocol illustrated in Appendixes A and B, the BusCtl line is used to carry wakeup signals, strobe signals, portions of the command control information, and terminate signals. According to one embodiment of the invention, clock cycles are divided into even and odd phases. The command control information is preceded by a non-zero value "start bit" on the BusCtl line at an even phase of the clock cycle. Upon detection of a start bit, a DRAM knows that any signals on the BusCtl line during the three subsequent odd phases of the clock cycle are part of the command control information, and not strobe, wakeup or terminate signals. The strobe signals, wakeup signals and terminate signals are all indicated by non-zero values on the BusCtl line at an odd phase of the clock cycle. Consequently, the DRAM must have some mechanism for distinguishing between the signals.

In an embodiment of the invention that uses fixed interleaves, an operation begins at a fixed interval relative to the command control information that specifies the operation. Therefore, DRAMs simply use the arrival time of the command control information and the known interval to determine when to perform the operation. The terminate signal associated with a transaction is always the next odd-phased signal on the BusCtl line after its corresponding command control information. Therefore, if the command control information can be identified, the terminate signal can also be identified. Any signal on the BusCtl line during an odd phase of a clock cycle is a wakeup signal.

The method described above for distinguishing between identical control signals (i.e. control signals that use the same line and have the same characteristics) works well in an embodiment that employs fixed interleaves. However, where the timing interval between a request packet and its corresponding strobe signal is variable, a mechanism must be provided to indicate to the DRAMs when to look for the strobe signal that corresponds to a request packet that has been received.

In the example illustrated in Appendix B, the period between the transmission of the command control information for a transaction and the strobe signal for the transaction is not fixed. Consequently, the DRAM must have some other mechanism for determining that, of all the signals that arrive on the BusCtl line, the signal at clock cycle 47 is the strobe signal associated with the command control information for transaction 1.

According to one embodiment of the present invention, the DRAM is able to distinguish between identical signals on the BusCtl line based on knowledge of what information has previously appeared on the channel. To obtain information about data on the channel, the DRAM constantly monitors the channel. Because the DRAM constantly monitors the channel, the controller does not have to transmit wakeup signals to the DRAM. Therefore, the only identical signals on the BusCtl line are the strobe signal and the terminate signal.

According to this embodiment, the order in which the controller sends strobe and terminate signals must match the order in which the controller sends request packets. For example, if the controller transmits request packets for transactions 0, 1, and 2, in that order, then the controller must send strobe and terminate signals for transactions 0, 1, and 2, in that order.

Under the constraints described above, the DRAM has the information it requires to correctly identify the strobe and terminate signals on the channel. Specifically, the first control signal on the BusCtl line will always be a strobe signal associated with the first transaction. The control signal that follows any strobe signal is always the terminate signal for the transaction that corresponds to the preceding strobe signal. The control signal that follows any terminate signal will always be a strobe signal for the transaction that immediately follows the transaction associated with the previous strobe signal.

While the approach described above allows a DRAM to accurately identify strobe and terminate signals, it has two obvious disadvantages. First, it requires that all DRAMs monitor the channel at all times. If any DRAM fails to monitor the line for any period, the DRAM will not be able to accurately identify the identical control signals. Because the DRAM has to constantly monitor the channel, the DRAM will not be able to conserve energy by entering a power-down mode. The expense associated with keeping all DRAMs powered up at all times is significant.

The second disadvantage is that the controller must send the control signals in exactly the same order as the command control information. As a result, the controller is limited with respect to the type of interleave patterns it may select. Specifically, the controller may not select any interleave patterns that retire a transaction out of order.

According to an alternate embodiment of the present invention, the controller is configured to transmit, as part of the command control information in a request packet, data which allows the DRAM to identify the strobe signal that corresponds to the command control information. For example, in one embodiment, the controller includes a "Pend" value in the command control information. The Pend value in a request packet indicates how many control signals that are identical to the strobe signal will occur between the end of the command control information for a transaction and the actual strobe signal for the transaction. Based on the Pend value, a DRAM is able to identify control signals without having to know what has transpired on the channel prior to the arrival of the command control information.

In the example illustrated in Appendix B, the command control information for transaction 1 is sent at clock cycle 24, and the strobe signal for transaction 1 is sent at clock cycle 47. Between the transmission of the command control information for transaction 1 and the transmission of the strobe signal for transaction 1, a terminate signal for transaction 0, a wakeup signal for transaction 2 and a request packet for transaction 2 are sent. (The DRAM knows to ignore the command control information for transaction 1 by detecting its start bit on an even phase of the clock cycle.).

The terminate signal for transaction 0 and the wakeup signal for transaction 2 both have identical characteristics to strobe signals. Therefore, the Pend value sent in the command control information for transaction 1 is two. By this Pend value, the DRAM is made aware that two strobe-like signals will appear on the BusCtl line prior to the actual strobe signal for transaction 1. The DRAM monitors the channel after the receipt of the command control information for transaction 1. Based on the Pend information in the command control information for transaction 1 and the signals that occur on the channel after receipt of the command control information for transaction 1, the DRAM can identify the strobe for transaction 1.

The Pend approach overcomes the disadvantages of the constant channel monitoring approach because the DRAM involved in a transaction does not need to know what transpired on the channel prior to the arrival of the command control information for the transaction. Consequently, a DRAM may assume a powered down mode until the arrival of a wakeup signal just prior to the transmission of a request packet. In addition, the Pend approach does not require transactions to be retired in the same order as the order in which they are requested. Therefore, a controller may specify interleave patterns in which some transactions are retired out of order.

DEFERRED PRECHARGE NOTIFICATION

At the time that a request packet is transmitted by a controller, the controller may not have enough information to determine whether a precharge operation should be performed after the completion of the transaction. Therefore, according to one embodiment of the invention, the command control information sent in request packets does not contain an indication of whether or not a precharge is to be performed after the transaction. Rather, the controller communicates to the DRAM whether a precharge is to be performed when the terminate signal that initiates the termination of a transfer operation is sent to the DRAM. Because the transmission of the terminate signal is deferred, the determination of whether or not a precharge operation is appropriate may be made by the controller based on information obtained between the transmission of the request packet and the transmission of the terminate signal.

For example, at the time that the request packet is sent, additional requests for data from different rows in the same DRAM may not have arrived. Therefore, it would appear that no post-operation precharge is required. However, prior to the transmission of the terminate signal, a request may arrive for an operation to be performed on a different row of the same bank within a DRAM. When the controller sends the terminate signal for the current operation, the controller can communicate to the DRAM that a precharge operation is to be performed. The DRAM can therefore begin a precharge operation for the bank containing the appropriate row while the current data transfer operation is being completed.

The technique used by the controller to communicate whether a precharge is to be performed after an operation preferably takes advantage of the fact that data is typically transferred as a series of one or more fixed-sized packets, where each packet contains more data than can be transmitted during a single clock cycle. Because the transmission of a single packet is performed over multiple clock cycles, the terminate signal may be sent during any one of a plurality of clock cycles to specify that a particular packet is the last packet. For example, assume that it takes four clock cycles to send a single packet of data, and that the DRAM is configured to send exactly one data packet after receipt of the terminate signal. As long as the terminate signal is sent at any one of the four clock cycles during which the penultimate data packet is sent, the data transmission will terminate at the appropriate time.

According to one embodiment of the invention, the controller uses the exact timing of the terminate signal to indicate to the DRAM whether the DRAM is to perform a precharge operation. For example, assume that the controller can terminate a transfer at the appropriate time by sending the terminate signal during any one of four clock cycles, as described above. The controller can indicate to the DRAM that precharge is to be performed by transmitting the terminate signal in the first of the four possible clock cycles, and indicate that precharge is not to be performed by transmitting the terminate signal on the second of the four possible clock cycles. The DRAM decodes the precharge information by determining on which of the four possible clock cycles the terminate signal appeared. The DRAM may make this determination, for example, by determining the modulus of the clock cycle on which the terminate signal was received relative to the clock cycle on which the corresponding strobe was received.

According to an alternate embodiment, a particular precharge operation is associated with each of the four available clock cycles. For example, the DRAM may contain four banks of memory. The technique described above may be extended so that a terminate signal in the first possible clock cycle causes the DRAM to precharge the first memory bank, a terminate signal in the second possible clock cycle causes the DRAM to precharge the second memory bank, a terminate signal in the third possible clock cycle causes the DRAM to precharge the third memory bank, and a terminate signal in the fourth possible clock cycle causes the DRAM to precharge the fourth memory bank. Significantly, this embodiment allows the position of the terminate signal for an operation on one memory bank to indicate that a precharge operation is to be performed on a different memory bank. In this embodiment, the command control information may contain a bit for specifying that no precharge is to be performed, regardless of the timing of the terminate signal.

OPTIMIZED OPERATION ENCODING

Typically, a controller indicates to a DRAM the operation it desires the DRAM to perform by transmitting to the DRAM a request packet that includes an operation code that corresponds to the desired operation. To determine how to respond to a request packet, each of the bits of the operation code must be wired from its point of reception on the DRAM and to a decoder prior to being globally transmitted through the interface in order to control functionality. The wiring and decoding process consumes space and power. A typical circuit for performing operation code decoding is illustrated in FIG. 14.

Figure 14:
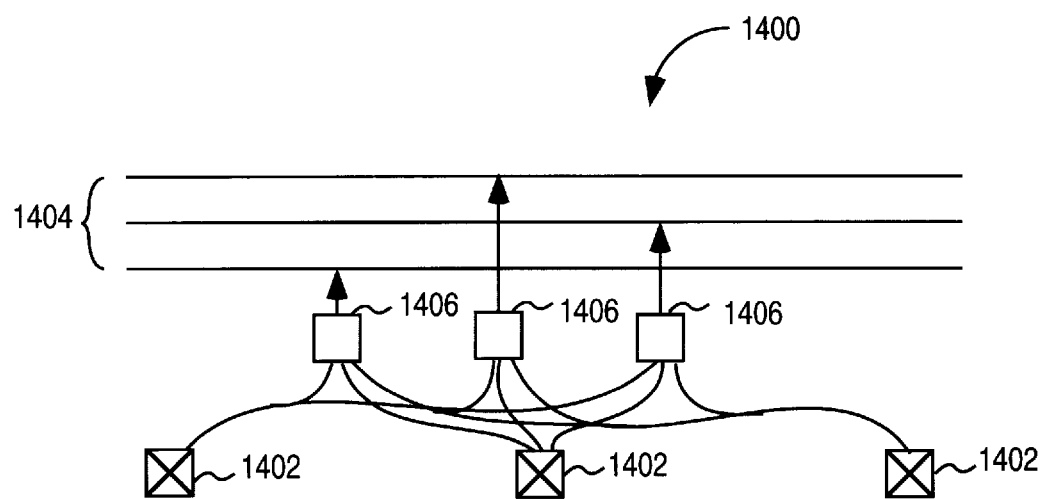
FIG. 14 illustrates circuitry for decoding operation codes according to the prior art.

Referring to FIG. 14, a decoding circuit 1400 includes a plurality of pins 1402, a plurality of global control lines 1404, and a plurality of decode units 1406. Each decode unit 1406 corresponds to a particular global control line 1404. When a multiple-bit operation code is received at pins 1402, the entire operation code is routed to each of decode units 1406. Each of decode units 1406 decodes the operation code to determine the appropriate signal to apply to the control line 1404 to which it corresponds.

Figure 15:
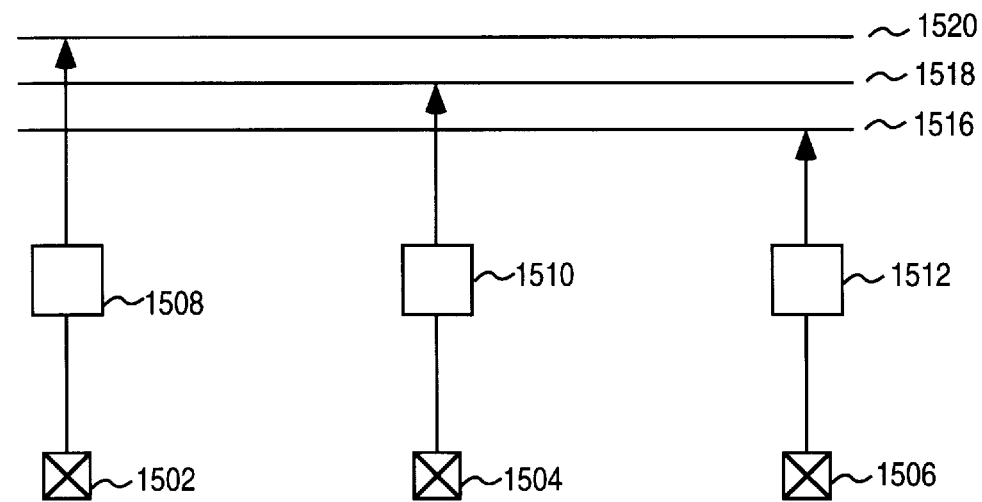
FIG. 15 illustrates circuitry for decoding operation codes according to one embodiment of the present invention.

Referring to FIG. 15, it illustrates a decode circuit 1500 according to an embodiment of the invention. Similar to decode circuit 1400, decode circuit 1500 includes a plurality of pins 1502, 1504 and 1506, a plurality of decode units 1508, 1510 and 1512, and a plurality of global control lines 1516, 1518 and 1520. Each of decode units 1508, 1510 and 1512 corresponds to one of the control lines 1516, 1518 and 1520. Unlike the prior art decode circuit 1400, each of decode units 1508, 1510 and 1512 receives only the signal from one pin. Based on the signal from the pin and state information stored in the decode unit, the decode unit applies the appropriate signal to the control line to which it corresponds.

The advantages of decode circuit 1500 over the prior art circuit shown in FIG. 14 include decreased wiring requirements, decreased power consumption and decreased circuit complexity. Specifically, only one line per pin is required to route the signals from pins 1502, 1504 and 1506 to decode units 1508, 1510 and 1512, respectively. Further, the complexity of decoders 1508, 1510 and 1512 is significantly reduced.

For decode circuit 1500 to work correctly, the operation codes transmitted by the controller must include bits that directly correspond to the signals carried on lines 1516, 1518 and 1520. Typically, the global control lines include a NoByteM line, a Reg line, and a Write line. The NoByteM line indicates whether a byte mask should be used on the data specified in the operation. The Reg line indicates whether the operation relates to a register or to memory. The Write line indicates whether the operation is a read operation or a write operation.

FIGS. 16A and 16B illustrates an operation code encoding scheme according to an embodiment of the invention. Referring to FIGS. 16A and 16B, they illustrate an operation-to-operation-code mapping in which bits in the operation code directly dictate the signals to be placed on each of the global control lines to perform the corresponding operation. Specifically, each operation code has a bit "OP[2]" that specifies whether a signal should be placed on the NoByteM control line, a bit "OP[1]" that specifies whether a signal should be placed on the Reg control line, and a bit "OP[O]" that specifies whether a signal should be placed on the Write control line. The operation code that corresponds to each possible type of operation has the various operation code bits set so as to cause the appropriate signals to be generated on the global control lines. For example, to perform a register read directed operation, a signal must be generated on the NoByteM and Reg control lines, but not on the Write control line. Therefore, in the operation code that corresponds to the register read directed operation, the bits that correspond to the NoByteM, Reg and Write control lines are respectively "1", "1" and "0".

BROADCAST OPERATIONS

Figure 17:
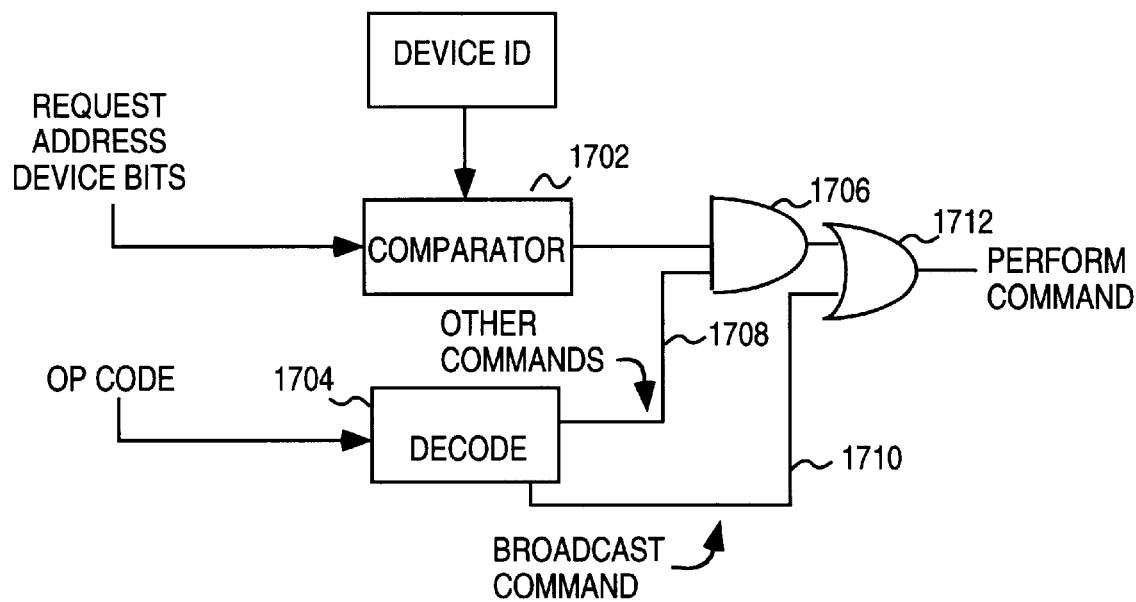
FIG. 17 illustrates a prior art circuit for determining whether a particular DRAM should respond to an operation request.

DRAMs respond to request packets if the operations specified in the request packets are specifically directed to the DRAM, or if the request packets specify broadcast operations. FIG. 17 illustrates a prior art circuit for determining whether a particular DRAM should respond to an operation request.

Referring to FIG. 17, a comparator 1702 compares the address bits in an request packet with the device ID of the DRAM. If the address bits in the request packet do not match the device ID, then a logical LOW is transmitted to one input of AND gate 1706. Consequently, the output of AND gate 1706 will be LOW. The operation code contained in the request is decoded by decode unit 1704. Decode unit 1704 decodes the operation code in the request packet and transmits signals over lines 1708 and 1710 based on the operation specified by the operation code. If the operation code represents a broadcast operation, then the decode unit 1704 applies a logical HIGH to line 1710. If the operation code represents a non-broadcast operation, then the decode unit 1704 transmits a signal on line 1708 indicative of the command, and a logical LOW on line 1710. Line 1710 and the output of AND gate 1706 are applied to an OR gate 1712. The signal at output of OR gate 1712 determines whether the DRAM should process the specified operation. When the specified operation is a broadcast operation, the output of OR gate 1712 will be HIGH regardless of the output of AND gate 1706.

Figure 18:
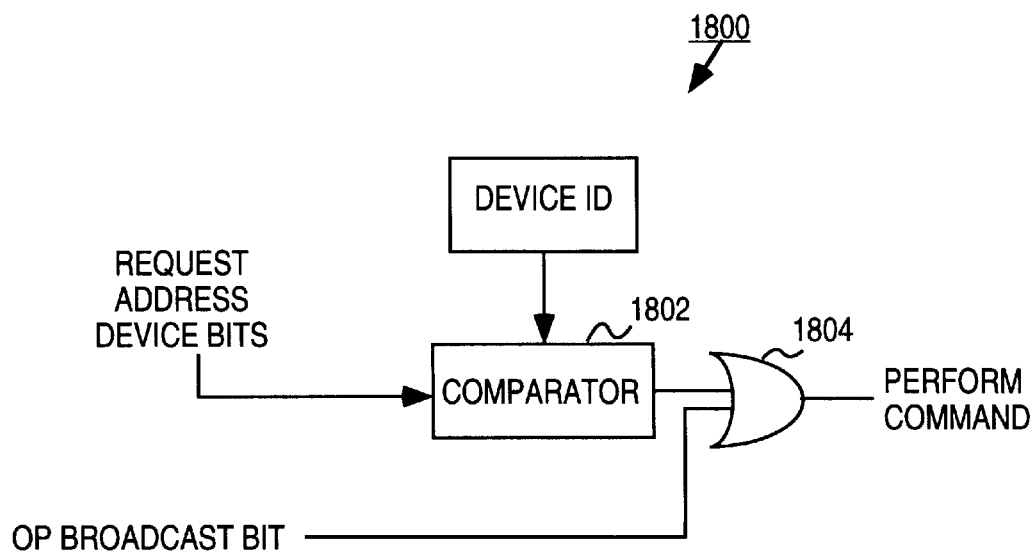
FIG. 18 illustrates a circuit for determining whether a particular DRAM should respond to an operation request according to an embodiment of the present invention.

Referring to FIG. 18, it illustrates a circuit for determining whether a DRAM should respond to request packet, according to an embodiment of the present invention. Similar to the circuit shown in FIG. 17, circuit 1800 includes a comparator 1802 for comparing the address bits in a request packet with the device ID of the DRAM. However, circuit 1800 is configured for a protocol in which one bit in the operation code of a request indicates whether the request is for a broadcast operation. Referring again to FIGS. 16A and 16B, the operation codes employed in one embodiment include a bit "Op[3]" that indicates whether the operation specified by the operation code is a broadcast operation.

Because the operation code contains a bit which indicates whether the operation is a broadcast operation, it is not necessary to decode the operation code to determine whether the operation is a broadcast operation. Rather, the value of the broadcast bit is fed directly into one input of an OR gate 1804. The other input of the OR gate 1804 receives a signal that indicates whether the address in the request matched the device ID of the DRAM. The output of the OR gate 1804 indicates whether the DRAM should respond to the request.

Because the operation code for every type of operation contains a bit that specifies whether the operation is a broadcast operation, the need to decode the operation codes to identify broadcast operations is avoided. Consequently, circuit 1800 is clearly simpler and more efficient that the circuit shown in FIG. 17.

CONTROLLER-SPECIFIED STATE CHANGES

In typical DRAMs, data is not directly transmitted from the storage cells. Rather, data is temporarily copied to sense amplifiers prior to transmission. Typically, the sense amplifiers only store one row of data. If an operation is to be performed on a row of data other than the currently stored row, two operations must be performed. The first operation is referred to as a precharge operation, where pairs of bit lines within the memory are equalized to a midpoint voltage level. The second operation is referred to as a sense operation, where the row on which the operation is to be performed is copied onto the sense amplifiers. Between the precharge operation and the subsequent sense operation, the DRAM in question is said to be in a closed state. At all other times, the DRAM is said to be in an open state.

In the prior art, DRAMs are configured to determine whether precharge and sense operations have to be performed prior to servicing a data transfer request from a controller. Typically, the DRAM performs this determination by comparing the address contained in the request packet to the current address in the bank. If the addresses match, then the data is transmitted from the sense amplifiers and no precharge or sense operations are required. If the addresses do not match, then the DRAM performs a precharge and sense operation to load the sense amplifiers with data from the appropriate row, but does not service the data transfer request.

The overhead and complexity required for the DRAM to perform the address comparison results in a significant cost and performance penalty. Consequently, the present invention provides a controller that determines whether precharge and/or sense operations are required prior to making data transfer requests. Because the controller makes the determination, the complexity of the DRAM is reduced while the performance of the overall data transfer system is improved. The controller makes the determination of whether precharge and/or sense operations are required based on the address of the data in the operation, the current state of the bank that corresponds to the address and the address of the data that is currently stored in the bank. Typically, this information is already maintained by the controller for other purposes. Therefore, little additional overhead is required for the controller to make the determination.

Once the controller has made the determination for a particular data transfer operation, the controller must communicate the decision to the DRAM. Preferably, the controller communicates the determination to the DRAM through data sent with the command control information for the transaction. According to one embodiment of the invention, the command control information includes two bits ("Open" and "Close") that indicate to the DRAM what action to take with respect to the sensing and precharging the memory cells that correspond to the operation. Based on the current bank state and the value of the Open and Close bits, the DRAM determines what action to perform.

In general, the Close bit indicates whether to precharge the memory bank after performing the operation specified in the command control information, and the Open bit indicates whether some type of sense or precharge/sense operation must be performed before the operation. The actions performed in response to the Open and Close bits depends on the previous state of the bank in question. FIG. 19 illustrates how the combinations of values for the Open bit, Close bit, and previous bank state are mapped to actions to be performed according to one embodiment of the invention.

Referring to FIG. 19, if the current bank state is closed and the Open and Close bits are "0" and "1", respectively, then the DRAM performs no action in response to the data transfer request. Since no action is performed, the state of the bank remains closed. If the current bank state is closed and the Open and Close bits are "1" and "0", respectively, then the DRAM senses the bank and then performs the operation specified in the command control information. After the operation is performed, the bank will be in the open state. If the current bank state is closed and the Open and Close bits are both "1", then the DRAM senses the bank, performs the specified operation, and precharges the bank. After these actions have been performed, the bank will be in the closed state. If the current bank state is closed, then both Open and Close bits cannot be "0".

If the current bank state is open and the Open and Close bits are both "0", then the DRAM simply performs the operation specified in the command control information. After the operation, the bank will still be in the open state. If the current bank state is open and the Open and Close bits are "0" and "1", respectively, then the DRAM performs the command and then precharges the memory bank. After the bank is precharged, it will be in the Closed state. If the current bank state is open and the Open and Close bits are "1" and "0", respectively, then the DRAM precharges the bank, senses the bank, and performs the specified operation. After the operation is performed, the bank will be in the open state. If the current bank state is open and the Open and Close bits are both "1", then the DRAM precharges the bank, senses the bank, performs the specified operation, then precharges the bank. After these actions have been performed, the bank will be in the closed state.

In addition to giving the controller significantly more control over internal DRAM operation, the present invention establishes a one-to-many correspondence between request packets and specified operations. Specifically, a single request packet can cause a DRAM to perform (1) a plurality of DRAM core operations, (2) a DRAM core operation and a data transfer operation, or (3) a data transfer operation and a plurality of DRAM core operations. By increasing the number of operations performed by the DRAM in response to a request packet, the ratio of control information per operations performed is significantly reduced.

LINE NOISE REDUCTION

In typical DRAMs, multiple banks of memory receive power over the same power supply line. Every precharge or sense operation performed on a bank of memory generates some noise on the power supply line to which the bank is connected. In general, memory banks are not aware of operations that are concurrently being performed by other memory banks. Consequently, two or more memory banks that are powered over the same power supply line may concurrently perform precharge and/or sense operations. The increased noise that the power supply line experiences due to the concurrent execution of multiple noise-producing operations impairs the reliability of the DRAM in question or forces the power supply line to be larger, consuming precious die area.

To prevent these reliability problems, those prior art DRAMs must be exhaustively tested to ensure that all possible sense and precharge patterns can be performed without error. In the present invention, the DRAM includes a control circuit that is configured to allow no more than one bank on any given power supply line from performing precharge or sense operations at any given time. Because the DRAM does not allow more than one bank on a power supply line to be charged or sensed at a time, the DRAM is not susceptible to the noise problems that concurrent sense and precharge operations create. Further, the DRAM does not need to be tested for patterns that will never occur. In addition, the die size of the DRAM may be reduced because the power supply lines do not have to be able to handle current for more than one operation. The control circuit within the DRAM may enforce this restriction in a variety of ways.

Figure 20A:
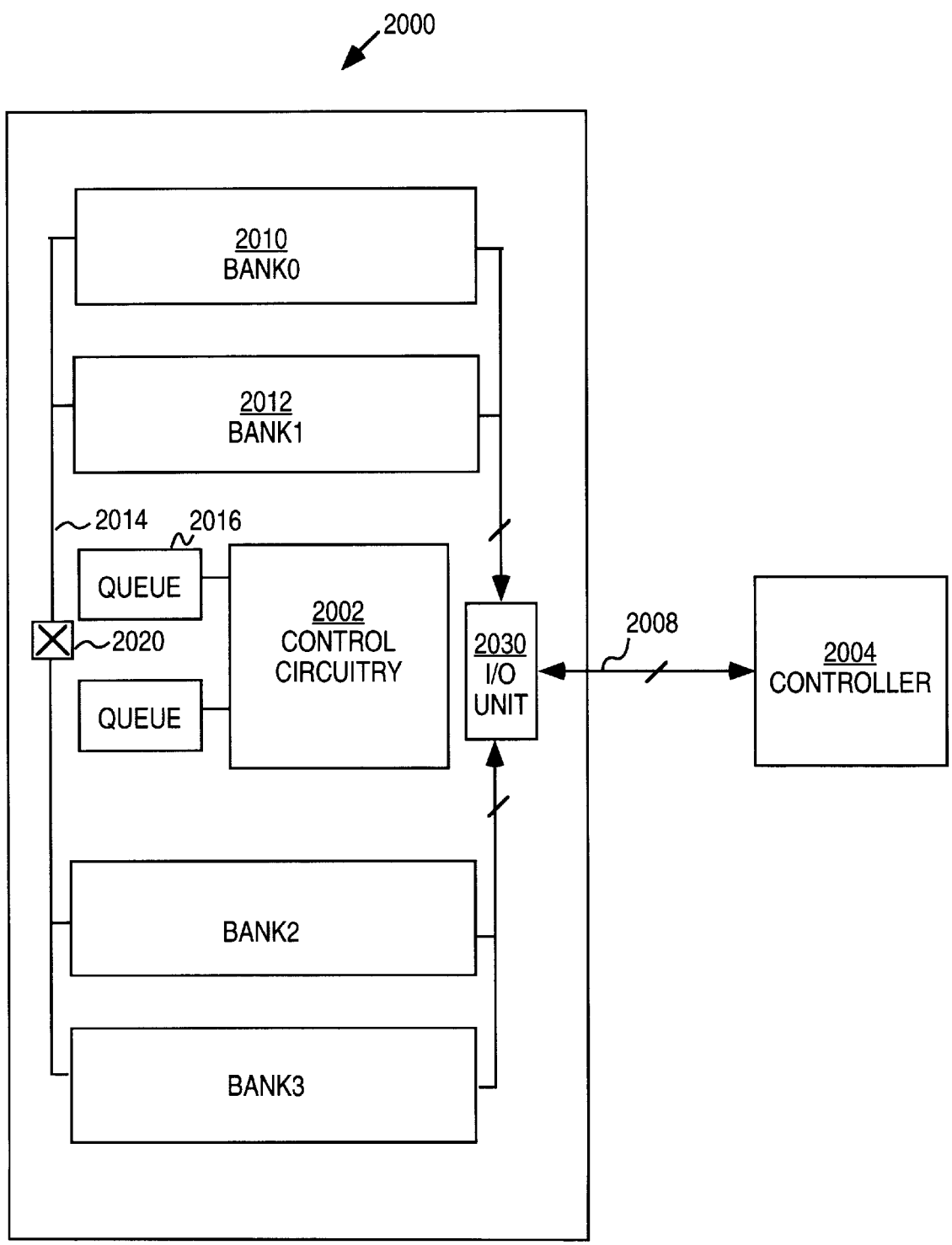
FIG. 20A is a block diagram illustrating a DRAM configured to allow no more than one high current operation to be performed over each internal power supply line according to an embodiment of the invention.

In one embodiment, the control circuit includes a queue for each power supply line. Such an embodiment is illustrated in FIG. 20A. Referring to FIG. 20A, a DRAM 2000 includes control circuitry 2002 and four memory banks powered over two power supply lines that extend from a bond site 2020. The control circuit 2002 receives request packets from the controller 2004 over the channel 2008 through an I/O unit 2030. The request packets specify data transfer operations and the memory banks on which the operations are to be performed. The control circuit 2002 is configured to detect when the specified operations require precharge or sense operations. When a requested operation requires a precharge or a sense operation, the operation is placed on the queue associated with the power supply line to which the memory bank specified in the request packet is connected. For example, assume that control circuit 2002 receives a request packet that specifies an operation that requires bank 2010 to be precharged, and a request packet that specifies an operation that requires bank 2012 to be sensed. Banks 2010 and 2012 are powered by the same power supply line 2014. Therefore, control circuitry 2002 will place both operations in the queue 2016 associated with power supply line 2014.

The control circuit 2002 services the operations in any given queue one at a time. Thus, in the example given above, the control circuitry 2002 may cause the operation on bank 2010 to be performed, then cause the operation on bank 2012 to be performed. Because the operations are serviced sequentially, no more than one sense or precharge operation will be performed concurrently on banks connected to the same power supply line. Because the control circuitry 2002 maintains separate queues for each power supply line, precharge and sense operation may be perform concurrently on banks that are powered by different power supply lines within the same DRAM 2000. In this embodiment, the controller 2004 is preferably configured to set the Open and Close bits in each request packet to prevent the queues associated with the power supply lines from overflowing.

In an alternate embodiment, control circuitry 2002 is configured to ignore request packets for operations that require a sense or precharge operation to be performed on a bank that is connected to the same power supply line as another bank on which a sense or precharge operation is currently being performed. In yet another embodiment, control circuitry 2002 does not process request packets that would violate the restriction, but transmits a message back to the controller 2004 to indicate that the request packet will not be serviced.

While a prohibition against concurrent sense and precharge operations by banks on the same power supply line limits the amount of concurrency that can take place between the memory banks, the overall architecture of the present invention is designed to maximize channel utilization without violating this restriction. Specifically, the controller adjusts the interleave of transactions in such a way as to maximize usage of the channel. No amount of concurrency within a DRAM will increase the throughput of a channel that is already fully utilized. Therefore, the enforcement of a prohibition against concurrent sense and precharge operations by banks on the same power supply line does not detrimentally affect the performance of the data transport system.

Figure 20B:
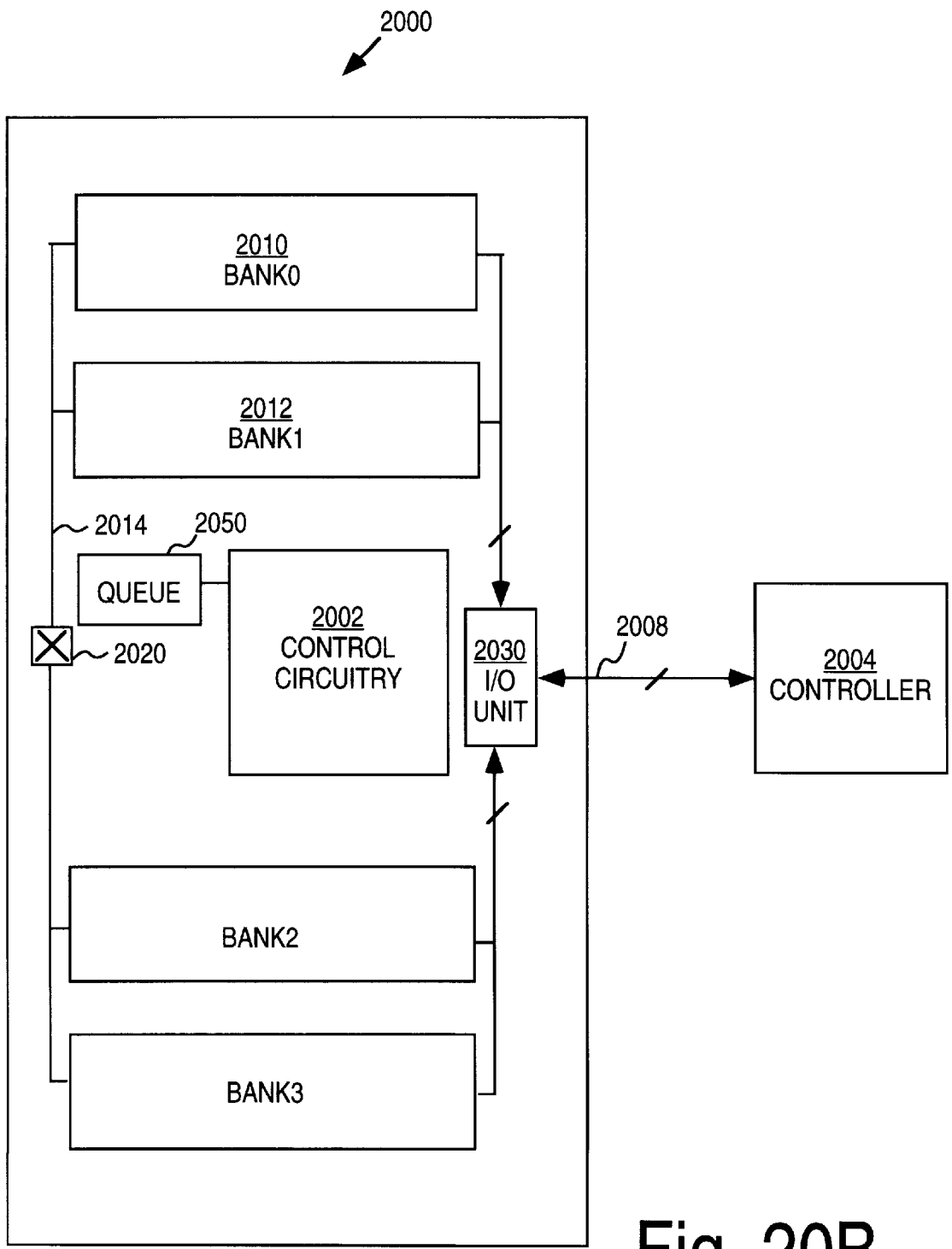
FIG. 20B is a block diagram illustrating a DRAM configured to allow no more than one high current operation to be performed within the DRAM at any given time according to an embodiment of the invention.

In an alternate embodiment illustrated in FIG. 20B, the DRAM 2000 contains a single queue 2050. All operations that require the DRAM 2000 to perform a precharge or sense operation on any memory bank within DRAM 2000 of FIG. 20B are placed in the queue 2050 by control circuitry 2002. The control circuitry 2002 processes the operations stored in the queue 2050 sequentially, preventing more than one precharge or sense operation from being performed at the same time. While this embodiment does not allow the concurrency that is possible with the one-queue-per-power supply line embodiment, it requires less complex control circuitry.

In yet another embodiment, the control circuitry on the DRAM does not enforce the one core operation per power supply line restriction. Rather, control circuitry within the controller is configured to transmit request packets by selecting an order and timing that will not cause more than one core operation to be performed at the same time on banks connected to the same power supply line. In this embodiment, the DRAM may be manufactured with power supply lines designed to only support one core operation at a time, even though the DRAM itself does not enforce the restriction.

EXAMPLE OF DYNAMICALLY ADJUSTING INTERLEAVE

Referring to Appendix C, it illustrates a series of transactions in which a controller has dynamically adjusted the interleave. The controller transmits the wakeup signal for the first transaction (transaction 0) over the BusCtrl line at clock cycle 0. The controller transmits the request packet for transaction 0 over the BusCtrl line and the BusData[8:0] lines from clock cycle 4 to clock cycle 6. The controller transmits column address information over the BusEnable line from clock cycle 8 to clock cycle 10. This column address information indicates the column address of the data for the second and subsequent data packets that will be involved in the transaction. The column address of the data for the first packet is included in the request packet. At clock cycle 10, the controller transmits the strobe signal for transaction 0. The timing of the strobe signal indicates to the DRAM when the DRAM is to begin retrieving and sending data for transaction 0. In response to the strobe signal, the DRAM begins to retrieve data from the specified columns at clock cycle 10, and begins sending the data over BusData [8:0] lines at clock cycle 16. The DRAM first retrieves data from the column specified in the request packet, and then from the columns specified in the column address information that is sent over the BusEnable line. The controller transmits the terminate signal for transaction 0 over the BusCtrl line at clock cycle 15. The timing of the terminate signal indicates to the DRAM when to stop sending data for transaction 0. In response to the terminate signal, the DRAM ceases to retrieve data after clock cycle 18, and ceases to transfer data after clock cycle 23. A total of two octbyte data packets are transmitted for transaction 0.

The controller transmits the wakeup signal for the transaction 1 over the BusCtrl line at clock cycle 8. The controller transmits the request packet for transaction 1 over the BusCtrl line and the BusData[8:0] lines from clock cycle 12 to clock cycle 14. The controller transmits column address information over the BusEnable line from clock cycle 20 to clock cycle 31. This column address information indicates the column address of the data for the second and subsequent data packets that will be involved in the transaction. The column address of the data for the first packet is included in the request packet. At clock cycle 22, the controller transmits the strobe signal for transaction 1. The timing of the strobe signal indicates to the DRAM when the DRAM is to begin retrieving and sending data for transaction 1. In response to the strobe signal, the DRAM begins to retrieve data from the specified columns at clock cycle 23, and begins sending the data over BusData[8:0] lines at clock cycle 28. The DRAM first retrieves data from the column specified in the request packet, and then from the columns specified in the column address information that is sent over the BusEnable line. The controller transmits the terminate signal for transaction 1 over the BusCtrl line at clock cycle 35. The timing of the terminate signal indicates to the DRAM when to stop sending data for transaction 1. In response to the terminate signal, the DRAM ceases to retrieve data after clock cycle 38, and ceases to transfer data after clock cycle 43. A total of four octbyte data packets are transmitted for transaction 1.

The controller transmits the wakeup signal for the transaction 2 over the BusCtrl line at clock cycle 20. The controller transmits the request packet for transaction 2 over the BusCtrl line and the BusData[8:0] lines from clock cycle 24 to clock cycle 26. The controller does not transmit column address information over the BusEnable line because transaction 1 involves only one octbyte data packet, the column address for which is included in the request packet. At clock cycle 50, the controller transmits the strobe signal for transaction 2. The timing of the strobe signal indicates to the DRAM when the DRAM is to begin retrieving and sending data for transaction 2. In response to the strobe signal, the DRAM begins to retrieve data from the specified columns at clock cycle 51, and begins sending the data over BusData[8:0] lines at clock cycle 56. The controller transmits the terminate signal for transaction 2 over the BusCtrl line at clock cycle 51. The timing of the terminate signal indicates to the DRAM when to stop sending data for transaction 2. In response to the terminate signal, the DRAM ceases to retrieve data after clock cycle 54, and ceases to transfer data after clock cycle 59. A single octbyte data packet is transmitted for transaction 2.

The controller transmits the wakeup signal for the transaction 3 over the BusCtrl line at clock cycle 40. The controller transmits the request packet for transaction 3 over the BusCtrl line and the BusData[8:0] lines from clock cycle 44 to clock cycle 46. The "open, no-close" parameters contained within the request packet indicates to the DRAM that the DRAM must perform a precharge and sense operation prior to performing the requested data transfer. Without waiting for the strobe signal for transaction 3, the DRAM performs the precharge operation from clock cycle 50 to clock cycle 57, and the sense operation from clock cycle 58 to clock cycle 65. After the sense operation, a RAS operation is performed from clock cycle 66 to clock cycle 73. The controller does not transmit column address information over the BusEnable line because transaction 3 involves only one octbyte data packet, the column address for which is included in the request packet. At clock cycle 66, the controller transmits the strobe signal for transaction 3. The timing of the strobe signal indicates to the DRAM when the DRAM is to begin retrieving and sending data for transaction 3. In response to the strobe signal, the DRAM begins to retrieve data from the specified columns at clock cycle 66, and begins sending the data over BusData[8:0] lines at clock cycle 72. The controller transmits the terminate signal for transaction 3 over the BusCtrl line at clock cycle 67. The timing of the terminate signal indicates to the DRAM when to stop sending data for transaction 3. In response to the terminate signal, the DRAM ceases to retrieve data after clock cycle 70, and ceases to transfer data after clock cycle 75. A total of one octbyte data packet is transmitted for transaction 3.

The controller transmits the wakeup signal for the transaction 4 over the BusCtrl line at clock cycle 48. The controller transmits the request packet for transaction 4 over the BusCtrl line and the BusData[8:0] lines from clock cycle 52 to clock cycle 54. The controller does not transmit column address information over the BusEnable line because transaction 1 involves only one octbyte data packet, the column address for which is included in the request packet. At clock cycle 58, the controller transmits the strobe signal for transaction 4. The fining of the strobe signal indicates to the DRAM when the DRAM is to begin retrieving and sending data for transaction 4. In response to the strobe signal, the DRAM begins to retrieve data from the specified columns at clock cycle 59, and begins sending the data over BusData[8:0] lines at clock cycle 64. The controller transmits the terminate signal for transaction 4 over the BusCtrl line at clock cycle 59. The timing of the terminate signal indicates to the DRAM when to stop sending data for transaction 4. In response to the terminate signal, the DRAM ceases to retrieve data after clock cycle 62, and ceases to transfer data after clock cycle 67. A single octbyte data packet is transmitted for transaction 4.

The transactions described above illustrate how the protocol employed by the present invention enables a controller to dynamically adjust numerous parameters relating to the timing and interleave of signals on the channel. For example, each of the transactions illustrates how the controller uses strobe and terminate signals to determine the timing and size of data transfers. Thus, the size of the request packets for transaction 1 and transaction 3 are equal, but four times as much data is transmitted in transaction 1 as in transaction 3 because of the relative delay between the strobe and terminate signals for transaction 1.

In addition, the controller can dynamically adjust the time between a request packet and the transmission of the data associated with the request. For example, three clock cycles elapse between the transmission of the request packet and the transmission of the strobe signal that dictates when the DRAM starts to send data for transaction 0. In contrast, twenty-one clock cycles elapse between the transmission of the request packet for transaction 2 and the strobe signal that dictates when the DRAM starts to send data for transaction 2.

Because the controller is able to adjust the time between the transmission of a request packet of a transaction and the transmission of data involved in the transaction, the controller can delay the transmission of data to allow the channel to be used for other purposes prior to the transmission of data. For example, the only signals sent over the BusCtrl and BusData[8:0] lines between the request packet for transaction 0 and the strobe for transaction 0 is a wakeup signal for transaction 1. Therefore, the strobe signal for transaction 0 is sent three clock cycles after the request packet for transaction 0. In contrast, the signals sent over the BusCtrl and BusData[8:0] lines between the request packet for transaction 2 and the strobe signal for transaction 2 include the data for transaction 1, the terminate signal for transaction 1, the wakeup signal for transaction 3, the request packet for transaction 3 and the wakeup signal for transaction 4. To allow all of this information to be sent before the data for transaction 3, the strobe signal for transaction 3 is not sent until 24 clock cycles after the request packet for transaction 3.

The transactions illustrated in Appendix C also illustrate that the protocol of the present invention enables a controller to alter the retirement order of transactions. In a typical DRAM system, transactions are serviced in the same order in which they are requested. However, the protocol of the present invention enables a controller to retire transactions out of order. In the example illustrated in Appendix C, the request packet for transaction 3 is transmitted at clock cycle 44 and the request packet for transaction 4 is transmitted 8 clock cycles later at clock cycle 52. However, the strobe to start the data transfer for transaction 4 is transmitted at clock cycle 58, while the strobe to start the data transfer for transaction 3 is not transmitted until clock cycle 66. Consequently, transaction 4 is completely retired before the transmission of the data involved in transaction 3 even begins.

The transactions illustrated in Appendix C also illustrate that the protocol of the present invention enables a controller to adjust the interleave in a manner that causes the number of transactions outstanding on the channel to vary over time. For example, at clock cycle 15, two transactions have been requested and none have been completed. Thus, two requests are outstanding. At clock cycle 55, five transactions have been requested and two have been completed. Thus, three requests are outstanding.

As explained above, the protocol of the present invention enables a controller to dynamically adjust (1) the time at which data is sent relative to the time at which it is requested, (2) the retirement order of transactions, and (3) the number of outstanding requests. In addition, the protocol enables a controller to dictate the core operations to be performed by the DRAM, and the sequence in which the DRAM is to perform the core operations. The enhanced channel control bestowed by the protocol gives the controller the flexibility necessary to maximize the channel usage, allowing any given set of data transactions to be completed within a shorter period of time.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

APPENDIX A

Explanation of Transaction Templates 1.0 Introduction

This appendix contains a transaction template that shows the information that is communicated over a channel and the internal DRAM core states that occur during a series of transactions.

Timing information proceeds down the template, with each horizontal row representing a clock cycle or two bus samples. Each row represents 4 ns at 500 MHz or 3.75 ns at 533 MHz.

1.1 Clk Cyc Column

The first column, labeled clock cycles, represents the time in clock cycles since the beginning of this template.

1.2 BE Column

The 2nd column labeled BE, is the state of the BusEnable pin during that clock cycle. BusEnable is only used to send serial addresses to the RDRAM.

1.3 BC Column

The 3rd column labeled BC, is the state of the BusCtrl pin during that clock cycle. BusCtrl is used to send request packets, strobe, terminate and wakeup information. During a request packet, this fields identifies the request number, so requests and data can be tracked, the request type, and the value of the Pend field for that transaction. For wakeup, strobes, and terminates it also indicates which transaction is being started, strobed and terminated, by the value carried with it, i.e. (strobe 0)

1.4 BD[8:0] Column

The 4th column, labeled BD[8:0], is the state of the BusData wires during that clock cycle. During the data packet it indicates the transaction number and the octbyte being sent or received. During request packets it indicates the state of the control bits Open and Close. These bits are used to tell the RDRAM what core operations to perform. The state that is assumed for the bank being accessed and the addressed bank is also included in the last field of a request packet.

1.5 DRAM internal state columns

The 5th through 9th Columns represent the activity in an RDRAM labeled 0, with the 5th column being it's CAS activity, and the next four being the activity or state of each of the 4 banks (Bank[0:3]). The 10th through 14th Columns represent the activity in any other RDRAM, labeled 1, with the 10th column being it's CAS activity, and the next four being the activity or state of each of the 4 banks (Bank[0:3]).

1.6 Column encoding

The column encodings consist of two numbers. The first is the request number. The second is the octbyte number.

1.7 Bank[0:3] encodings.

These columns include a symbol that represents an operation and the number of the transaction that caused the operation. The meaning of the symbols is given in the table below.

| Symbol | Name | Meaning | Length |
|---|---|---|---|
| p | Precharge | Precharge is the closing of a page (deassertion of RAS) and can be caused by closing at the end of a transaction, or opening a page that has not previously been precharged | 8 Clocks |
| s | Sense | Sense is the operation of loading the sense amps to prepare for a CAS and is caused by a command with Open required | 8 Clocks |
| r | RAS | RAS always follows the sense, and is needed to insure that the minimum RAS low time of the core is met. | 8 Clocks |

Non-interleaved precharged 4 oct 1 bank RWWRR

| Clk Cyc | BE | BC | BD[8:0] | !0 !Col | Bank 0 | 1 | 2 | 3 | !1 !Col | Bank 0 | 1 | 2 | 3 | ! |
|---|---|---|---|---|---|---|---|---|---|---|---|---|---|---|
| 0 | — | wakeup 0 | — | — | — | — | — | — | — | — | — | — | — | — |
| 1 | — | — | — | — | — | — | — | — | — | — | — | — | — | — |
| 2 | — | — | — | — | — | — | — | — | — | — | — | — | — | — |
| 3 | — | — | — | — | — | — | — | — | — | — | — | — | — | — |
| 4 | — | req 0 | open | — | — | — | — | — | — | — | — | — | — | — |
| 5 | — | read | close | — | — | — | — | — | — | — | — | — | — | — |
| 6 | — | pend 0 | precharged 0 | — | — | — | — | — | — | — | — | — | — | — |
| 7 | — | — | — | — | — | — | — | — | — | — | — | — | — | — |
| 8 | — | — | — | — | — | — | — | — | — | — | — | — | — | — |
| 9 | — | — | — | — | — | — | — | — | — | — | — | — | — | — |
| 10 | — | — | — | — | s0 | — | — | — | — | — | — | — | — | — |
| 11 | — | — | — | — | s0 | — | — | — | — | — | — | — | — | — |
| 12 | — | — | — | — | s0 | — | — | — | — | — | — | — | — | — |
| 13 | — | — | — | — | s0 | — | — | — | — | — | — | — | — | — |
| 14 | — | — | — | — | s0 | — | — | — | — | — | — | — | — | — |
| 15 | 0 1 | — | — | — | s0 | — | — | — | — | — | — | — | — | — |
| 16 | 0 1 | — | — | — | s0 | — | — | — | — | — | — | — | — | — |
| 17 | 0 1 | strobe 0 | — | — | s0 | — | — | — | — | — | — | — | — | — |
| 18 | 0 1 | — | — | 0 0 | r0 | — | — | — | — | — | — | — | — | — |
| 19 | 0 2 | — | — | 0 0 | r0 | — | — | — | — | — | — | — | — | — |
| 20 | 0 2 | — | — | 0 0 | r0 | — | — | — | — | — | — | — | — | — |
| 21 | 0 2 | — | — | 0 0 | r0 | — | — | — | — | — | — | — | — | — |
| 22 | 0 2 | — | turn | 0 1 | r0 | — | — | — | — | — | — | — | — | — |
| 23 | 0 3 | — | data 0 0 | 0 1 | r0 | — | — | — | — | — | — | — | — | — |
| 24 | 0 3 | — | data 0 0 | 0 1 | r0 | — | — | — | — | — | — | — | — | — |
| 25 | 0 3 | — | data 0 0 | 0 1 | r0 | — | — | — | — | — | — | — | — | — |
| 26 | 0 3 | — | data 0 0 | 0 2 | — | — | — | — | — | — | — | — | — | — |
| 27 | — | — | data 0 1 | 0 2 | — | — | — | — | — | — | — | — | — | — |
| 28 | — | — | data 0 1 | 0 2 | — | — | — | — | — | — | — | — | — | — |
| 29 | — | — | data 0 1 | 0 2 | — | — | — | — | — | — | — | — | — | — |
| 30 | — | term 0 | data 0 1 | 0 3 | — | — | — | — | — | — | — | — | — | — |

-continued

| | | | | | | | | | | | | |
|---|---|---|---|---|---|---|---|---|---|---|---|---|
| 31 | — — | data 0 2 | 0 3 | — | — | — | — — | — | — | — | — |
| 32 | — — | data 0 2 | 0 3 | — | — | — | — — | — | — | — | — |
| 33 | — — | data 0 2 | 0 3 | — | — | — | — — | — | — | — | — |
| 34 | — — | data 0 2 | — | — | — | — | — — | — | — | — | — |
| 35 | — wakeup 1 | data 0 3 | — | p0 | — | — | — — | — | — | — | — |
| 36 | — — | data 0 3 | — | p0 | — | — | — — | — | — | — | — |
| 37 | — — | data 0 3 | — | p0 | — | — | — — | — | — | — | — |
| 38 | — — | data 0 3 | — | p0 | — | — | — — | — | — | — | — |
| 39 | — req 1 | open | — | p0 | — | — | — — | — | — | — | — |
| 40 | — write | close | — | p0 | — | — | — — | — | — | — | — |
| 41 | — pend 0 | precharged 0 | — | p0 | — | — | — — | — | — | — | — |
| 42 | — — | — | — | p0 | — | — | — — | — | — | — | — |
| 43 | — — | — | — | — | — | — | — — | — | — | — | — |
| 44 | 1 1 — | — | — | — | — | — | — — | — | — | — | — |
| 45 | 1 1 — | — | — | s1 | — | — | — — | — | — | — | — |
| 46 | 1 1 — | — | — | s1 | — | — | — — | — | — | — | — |
| 47 | 1 1 strobe 1 | — | — | s1 | — | — | — — | — | — | — | — |
| 48 | 1 2 — | data 1 0 | — | s1 | — | — | — — | — | — | — | — |
| 49 | 1 2 — | data 1 0 | — | s1 | — | — | — — | — | — | — | — |
| 50 | 1 2 — | data 1 0 | — | s1 | — | — | — — | — | — | — | — |
| 51 | 1 2 — | data 1 0 | — | s1 | — | — | — — | — | — | — | — |
| 52 | 1 3 — | data 1 1 | — | s1 | — | — | — — | — | — | — | — |
| 53 | 1 3 — | data 1 1 | 1 0 | r1 | — | — | — — | — | — | — | — |
| 54 | 1 3 — | data 1 1 | 1 0 | r1 | — | — | — — | — | — | — | — |
| 55 | 1 3 — | data 1 1 | 1 0 | r1 | — | — | — — | — | — | — | — |
| 56 | — — | data 1 2 | 1 0 | r1 | — | — | — — | — | — | — | — |
| 57 | — — | data 1 2 | 1 1 | r1 | — | — | — — | — | — | — | — |
| 58 | — — | data 1 2 | 1 1 | r1 | — | — | — — | — | — | — | — |
| 59 | — — | data 1 2 | 1 1 | r1 | — | — | — — | — | — | — | — |
| 60 | — term 1 | data 1 3 | 1 1 | r1 | — | — | — — | — | — | — | — |
| 61 | — — | data 1 3 | 1 2 | — | — | — | — — | — | — | — | — |
| 62 | — — | data 1 3 | 1 2 | — | — | — | — — | — | — | — | — |
| 63 | — — | data 1 3 | 1 2 | — | — | — | — — | — | — | — | — |
| 64 | — — | — | 1 2 | — | — | — | — — | — | — | — | — |
| 65 | — — | — | 1 3 | — | — | — | — — | — | — | — | — |
| 66 | — — | — | 1 3 | — | — | — | — — | — | — | — | — |
| 67 | — wakeup 2 | — | 1 3 | — | — | — | — — | — | — | — | — |
| 68 | — — | — | 1 3 | — | — | — | — — | — | — | — | — |
| 69 | — — | — | — | p1 | — | — | — — | — | — | — | — |
| 70 | — — | — | — | p1 | — | — | — — | — | — | — | — |
| 71 | — req 2 | open | — | p1 | — | — | — — | — | — | — | — |
| 72 | — write | close | — | p1 | — | — | — — | — | — | — | — |
| 73 | — pend 0 | precharged 0 | — | p1 | — | — | — — | — | — | — | — |
| 74 | — — | — | — | p1 | — | — | — — | — | — | — | — |
| 75 | — — | — | — | p1 | — | — | — — | — | — | — | — |
| 76 | 2 1 — | — | — | p1 | — | — | — — | — | — | — | — |
| 77 | 2 1 — | — | — | s2 | — | — | — — | — | — | — | — |
| 78 | 2 1 — | — | — | s2 | — | — | — — | — | — | — | — |
| 79 | 2 1 strobe 2 | — | — | s2 | — | — | — — | — | — | — | — |
| 80 | 2 2 — | data 2 0 | — | s2 | — | — | — — | — | — | — | — |
| 81 | 2 2 — | data 2 0 | — | s2 | — | — | — — | — | — | — | — |
| 82 | 2 2 — | data 2 0 | — | s2 | — | — | — — | — | — | — | — |
| 83 | 2 2 — | data 2 0 | — | s2 | — | — | — — | — | — | — | — |
| 84 | 2 3 — | data 2 1 | — | s2 | — | — | — — | — | — | — | — |
| 85 | 2 3 — | data 2 1 | 2 0 | r2 | — | — | — — | — | — | — | — |
| 86 | 2 3 — | data 2 1 | 2 0 | r2 | — | — | — — | — | — | — | — |
| 87 | 2 3 — | data 2 1 | 2 0 | r2 | — | — | — — | — | — | — | — |
| 88 | — — | data 2 2 | 2 0 | r2 | — | — | — — | — | — | — | — |
| 89 | — — | data 2 2 | 2 1 | r2 | — | — | — — | — | — | — | — |
| 90 | — — | data 2 2 | 2 1 | r2 | — | — | — — | — | — | — | — |
| 91 | — — | data 2 2 | 2 1 | r2 | — | — | — — | — | — | — | — |
| 92 | — term 2 | data 2 3 | 2 1 | r2 | — | — | — — | — | — | — | — |
| 93 | — — | data 2 3 | 2 2 | — | — | — | — — | — | — | — | — |
| 94 | — — | data 2 3 | 2 2 | — | — | — | — — | — | — | — | — |
| 95 | — — | data 2 3 | 2 2 | — | — | — | — — | — | — | — | — |
| 96 | — — | — | 2 2 | — | — | — | — — | — | — | — | — |
| 97 | — — | — | 2 3 | — | — | — | — — | — | — | — | — |
| 98 | — — | — | 2 3 | — | — | — | — — | — | — | — | — |
| 99 | — wakeup 3 | — | 2 3 | — | — | — | — — | — | — | — | — |
| 100 | — — | — | 2 3 | — | — | — | — — | — | — | — | — |
| 101 | — — | — | — | p2 | — | — | — — | — | — | — | — |
| 102 | — — | — | — | p2 | — | — | — — | — | — | — | — |
| 103 | — req 3 | open | — | p2 | — | — | — — | — | — | — | — |
| 104 | — read | close | — | p2 | — | — | — — | — | — | — | — |
| 105 | — pend 0 | precharged 0 | — | p2 | — | — | — — | — | — | — | — |
| 106 | — — | — | — | p2 | — | — | — — | — | — | — | — |
| 107 | — — | — | — | p2 | — | — | — — | — | — | — | — |
| 108 | — — | — | — | p2 | — | — | — — | — | — | — | — |
| 109 | — — | — | — | s3 | — | — | — — | — | — | — | — |
| 110 | — — | — | — | s3 | — | — | — — | — | — | — | — |

-continued

| Clk Cyc | BE | BC | | | |
|---|---|---|---|---|---|
| 111 | — — | — | — | s3 | — — — — — — — — |
| 112 | — — | — | — | s3 | — — — — — — — — |
| 113 | — — | — | — | s3 | — — — — — — — — |
| 114 | 3 1 — | — | — | s3 | — — — — — — — — |
| 115 | 3 1 — | — | — | s3 | — — — — — — — — |
| 116 | 3 1 strobe 3 | — | — | s3 | — — — — — — — — |
| 117 | 3 1 — | — | 3 0 | r3 | — — — — — — — — |
| 118 | 3 2 — | — | 3 0 | r3 | — — — — — — — — |
| 119 | 3 2 — | — | 3 0 | r3 | — — — — — — — — |
| 120 | 3 2 — | — | 3 0 | r3 | — — — — — — — — |
| 121 | 3 2 — | turn | 3 1 | r3 | — — — — — — — — |
| 122 | 3 3 — | data 3 0 | 3 1 | r3 | — — — — — — — — |
| 123 | 3 3 — | data 3 0 | 3 1 | r3 | — — — — — — — — |
| 124 | 3 3 — | data 3 0 | 3 1 | r3 | — — — — — — — — |
| 125 | 3 3 — | data 3 0 | 3 2 | — | — — — — — — — — |
| 126 | — — | data 3 1 | 3 2 | — | — — — — — — — — |
| 127 | — — | data 3 1 | 3 2 | — | — — — — — — — — |
| 128 | — — | data 3 1 | 3 2 | — | — — — — — — — — |
| 129 | — term 3 | data 3 1 | 3 3 | — | — — — — — — — — |
| 130 | — — | data 3 2 | 3 3 | — | — — — — — — — — |
| 131 | — — | data 3 2 | 3 3 | — | — — — — — — — — |
| 132 | — — | data 3 2 | 3 3 | — | — — — — — — — — |
| 133 | — — | data 3 2 | — | — | — — — — — — — — |
| 134 | — wakeup 4 | data 3 3 | — | p3 | — — — — — — — — |
| 135 | — — | data 3 3 | — | p3 | — — — — — — — — |
| 136 | — — | data 3 3 | — | p3 | — — — — — — — — |
| 137 | — — | data 3 3 | — | p3 | — — — — — — — — |
| 138 | — req 4 | open | — | p3 | — — — — — — — — |
| 139 | — read | close | — | p3 | — — — — — — — — |
| 140 | — pend 0 | precharged 0 | — | p3 | — — — — — — — — |
| 141 | — — | — | — | p3 | — — — — — — — — |
| 142 | — — | — | — | — | — — — — — — — — |
| 143 | — — | — | — | — | — — — — — — — — |
| 144 | — — | — | — | s4 | — — — — — — — — |
| 145 | — — | — | — | s4 | — — — — — — — — |
| 146 | — — | — | — | s4 | — — — — — — — — |
| 147 | — — | — | — | s4 | — — — — — — — — |
| 148 | — — | — | — | s4 | — — — — — — — — |
| 149 | 4 1 — | — | — | s4 | — — — — — — — — |
| 150 | 4 1 — | — | — | s4 | — — — — — — — — |
| 151 | 4 1 strobe 4 | — | — | s4 | — — — — — — — — |
| 152 | 4 1 — | — | 4 0 | r4 | — — — — — — — — |
| 153 | 4 2 — | — | 4 0 | r4 | — — — — — — — — |
| 154 | 4 2 — | — | 4 0 | r4 | — — — — — — — — |
| 155 | 4 2 — | — | 4 0 | r4 | — — — — — — — — |
| 156 | 4 2 — | turn | 4 1 | r4 | — — — — — — — — |
| 157 | 4 3 — | data 4 0 | 4 1 | r4 | — — — — — — — — |
| 158 | 4 3 — | data 4 0 | 4 1 | r4 | — — — — — — — — |
| 159 | 4 3 — | data 4 0 | 4 1 | r4 | — — — — — — — — |
| 160 | 4 3 — | data 4 0 | 4 2 | — | — — — — — — — — |
| 161 | — — | data 4 1 | 4 2 | — | — — — — — — — — |
| 162 | — — | data 4 1 | 4 2 | — | — — — — — — — — |
| 163 | — — | data 4 1 | 4 2 | — | — — — — — — — — |
| 164 | — term 4 | data 4 1 | 4 3 | — | — — — — — — — — |
| 165 | — — | data 4 2 | 4 3 | — | — — — — — — — — |
| 166 | — — | data 4 2 | 4 3 | — | — — — — — — — — |
| 167 | — — | data 4 2 | 4 3 | — | — — — — — — — — |
| 168 | — — | data 4 2 | — | — | — — — — — — — — |
| 169 | — — | data 4 3 | — | p4 | — — — — — — — — |
| 170 | — — | data 4 3 | — | p4 | — — — — — — — — |
| 171 | — — | data 4 3 | — | p4 | — — — — — — — — |
| 172 | — — | data 4 3 | — | p4 | — — — — — — — — |
| 173 | — — | — | — | p4 | — — — — — — — — |
| 174 | — — | — | — | p4 | — — — — — — — — |
| 175 | — — | — | — | p4 | — — — — — — — — |
| 176 | — — | — | — | p4 | — — — — — — — — |

APPENDIX B
Explanation of Transaction Templates
1.0 Introduction

This appendix contains a transaction template that shows the information that is communicated over a channel and the internal DRAM core states that occur during a series of transactions.

Timing information proceeds down the template, with each horizontal row representing a clock cycle or two bus samples. Each row represents 4 ns at 500 MHz or 3.75 ns at 533 MHz.

1.1 Clk Cyc Column

The first column, labeled clock cycles, represents the time in clock cycles since the beginning of this template.

1.2 BE Column

The 2nd column labeled BE, is the state of the BusEnable pin during that clock cycle. BusEnable is only used to send serial addresses to the RDRAM.

1.3 BC Column

The 3rd column labeled BC, is the state of the BusCtrl pin during that clock cycle. BusCtrl is used to send request packets, strobe, terminate and wakeup information. During a request packet, this fields identifies the request number, so requests and data can be tracked, the request type, and the value of the Pend field for that transaction. For wakeup, strobes, and terminates it also indicates which transaction is being started, strobed and terminated, by the value carried with it, i.e. (strobe 0)

1.4 BD[8:0] Column

The 4th column, labeled BD[8:0], is the state of the BusData wires during that clock cycle. During the data packet it indicates the transaction number and the octbyte being sent or received. During request packets it indicates the state of the control bits Open and Close. These bits are used to tell the RDRAM what core operations to perform. The state that is assumed for the bank being accessed and the addressed bank is also included in the last field of a request packet.

1.5 DRAM internal state columns

The 5th through 9th Columns represent the activity in an RDRAM labeled 0, with the 5th column being it's CAS activity, and the next four being the activity or state of each of the 4 banks (Bank[0:3]). The 10th through 14th Columns represent the activity in any other RDRAM, labeled 1, with the 10th column being it's CAS activity, and the next four being the activity or state of each of the 4 banks (Bank[0:3]).

1.6 Column encoding

The column encodings consist of two numbers. The first is the request number. The second is the octbyte number.

1.7 Bank[0:3] encodings.

These columns include a symbol that represents an operation and the number of the transaction that caused the operation. The meaning of the symbols is given in the table below.

| Symbol | Name | Meaning | Length |
|---|---|---|---|
| p | Precharge | Precharge is the closing of a page (deassertion of RAS) and can be caused by closing at the end of a transaction, or opening a page that has not previously been precharged | 8 Clocks |
| s | Sense | Sense is the operation of loading the sense amps to prepare for a CAS and is caused by a command with Open required | 8 Clocks |
| r | RAS | RAS always follows the sense, and is needed to insure that the minimum RAS low time of the core is met. | 8 Clocks |

Interleaved precharge 4 oct 2 bank 1 RDRAM RWWRWWRRR

| Clk Cyc | BE BC | BD[8:0] | !0 | Bank 0 | 1 | 2 | 3 | !1 !Col | Bank 0 | 1 | 2 | 3 | ! |
|---|---|---|---|---|---|---|---|---|---|---|---|---|---|
| 0 | — wakeup 0 | — | — | — | — | — | — — | — | — | — | — | |
| 1 | — — | | — | — | — | — | — — | — | — | — | — | |
| 2 | — — | | — | — | — | — | — — | — | — | — | — | |
| 3 | — — | | — | — | — | — | — — | — | — | — | — | |
| 4 | — req 0 | open | — | — | — | — | — — | — | — | — | — | |
| 5 | — read | close | — | — | — | — | — — | — | — | — | — | |
| 6 | — pend 1 | precharged 0 | — | — | — | — | — — | — | — | — | — | |
| 7 | — — | | — | — | — | — | — — | — | — | — | — | |
| 8 | — — | | — | — | — | — | — — | — | — | — | — | |
| 9 | — — | | — | — | — | — | — — | — | — | — | — | |
| 10 | — — | | — | s0 | — | — | — — | — | — | — | — | |
| 11 | — — | | — | s0 | — | — | — — | — | — | — | — | |
| 12 | — — | | — | s0 | — | — | — — | — | — | — | — | |
| 13 | — — | | — | s0 | — | — | — — | — | — | — | — | |
| 14 | — — | | — | s0 | — | — | — — | — | — | — | — | |
| 15 | — — | | — | s0 | — | — | — — | — | — | — | — | |
| 16 | — — | | — | s0 | — | — | — — | — | — | — | — | |
| 17 | — — | | — | s0 | — | — | — — | — | — | — | — | |
| 18 | — — | | 0 0 | r0 | — | — | — — | — | — | — | — | |
| 19 | — — | | 0 0 | r0 | — | — | — — | — | — | — | — | |
| 20 | 0 1 wakeup 1 | — | 0 0 | r0 | — | — | — — | — | — | — | — | |
| 21 | 0 1 — | | 0 0 | r0 | — | — | — — | — | — | — | — | |
| 22 | 0 1 strobe 0 | — | 0 0 | r0 | — | — | — — | — | — | — | — | |

-continued

| # | | | | | | | | | | | | | | |
|---|---|---|---|---|---|---|---|---|---|---|---|---|---|---|
| 23 | 0 | 1 | — | — | 0 | 0 | r0 | — | — | — | — | — | — | — |
| 24 | 0 | 2 | req 1 | open | 0 | 0 | r0 | — | — | — | — | — | — | — |
| 25 | 0 | 2 | write | close | 0 | 0 | r0 | — | — | — | — | — | — | — |
| 26 | 0 | 2 | pend 2 | precharged 1 | 0 | 0 | — | — | — | — | — | — | — | — |
| 27 | 0 | 2 | — | turn | 0 | 1 | — | — | — | — | — | — | — | — |
| 28 | 0 | 3 | — | data 0 0 | 0 | 1 | — | — | — | — | — | — | — | — |
| 29 | 0 | 3 | — | data 0 0 | 0 | 1 | — | — | — | — | — | — | — | — |
| 30 | 0 | 3 | — | data 0 0 | 0 | 1 | — | s1 | — | — | — | — | — | — |
| 31 | 0 | 3 | — | data 0 0 | 0 | 2 | — | s1 | — | — | — | — | — | — |
| 32 | — | — | — | data 0 1 | 0 | 2 | — | s1 | — | — | — | — | — | — |
| 33 | — | — | — | data 0 1 | 0 | 2 | — | s1 | — | — | — | — | — | — |
| 34 | — | — | — | data 0 1 | 0 | 2 | — | s1 | — | — | — | — | — | — |
| 35 | — | term 0 | | data 0 1 | 0 | 3 | — | s1 | — | — | — | — | — | — |
| 36 | — | — | — | data 0 2 | 0 | 3 | — | s1 | — | — | — | — | — | — |
| 37 | — | — | — | data 0 2 | 0 | 3 | — | s1 | — | — | — | — | — | — |
| 38 | — | — | — | data 0 2 | 0 | 3 | — | r1 | — | — | — | — | — | — |
| 39 | — | — | — | data 0 2 | — | — | — | r1 | — | — | — | — | — | — |
| 40 | — | wakeup 2 | | data 0 3 | — | — | p0 | r1 | — | — | — | — | — | — |
| 41 | — | — | — | data 0 3 | — | — | p0 | r1 | — | — | — | — | — | — |
| 42 | — | — | — | data 0 3 | — | — | p0 | r1 | — | — | — | — | — | — |
| 43 | — | — | — | data 0 3 | — | — | p0 | r1 | — | — | — | — | — | — |
| 44 | 1 | 1 | req 2 | open | — | — | p0 | r1 | — | — | — | — | — | — |
| 45 | 1 | 1 | write | close | — | — | p0 | r1 | — | — | — | — | — | — |
| 46 | 1 | 1 | pend 2 | precharged 0 | — | — | p0 | — | — | — | — | — | — | — |
| 47 | 1 | 1 | strobe 1 | — | — | — | p0 | — | — | — | — | — | — | — |
| 48 | 1 | 2 | — | data 1 0 | — | — | — | — | — | — | — | — | — | — |
| 49 | 1 | 2 | — | data 1 0 | — | — | — | — | — | — | — | — | — | — |
| 50 | 1 | 2 | — | data 1 0 | — | — | — | s2 | — | — | — | — | — | — |
| 51 | 1 | 2 | — | data 1 0 | — | — | — | s2 | — | — | — | — | — | — |
| 52 | 1 | 3 | — | data 1 1 | — | — | — | s2 | — | — | — | — | — | — |
| 53 | 1 | 3 | — | data 1 1 | 1 | 0 | — | s2 | — | — | — | — | — | — |
| 54 | 1 | 3 | — | data 1 1 | 1 | 0 | — | s2 | — | — | — | — | — | — |
| 55 | 1 | 3 | — | data 1 1 | 1 | 0 | — | s2 | — | — | — | — | — | — |
| 56 | — | — | — | data 1 2 | 1 | 0 | — | s2 | — | — | — | — | — | — |
| 57 | — | — | — | data 1 2 | 1 | 1 | — | s2 | — | — | — | — | — | — |
| 58 | — | — | — | data 1 2 | 1 | 1 | — | r2 | — | — | — | — | — | — |
| 59 | — | — | — | data 1 2 | 1 | 1 | — | r2 | — | — | — | — | — | — |
| 60 | — | term 1 | | data 1 3 | 1 | 1 | — | r2 | — | — | — | — | — | — |
| 61 | — | — | — | data 1 3 | 1 | 2 | — | r2 | — | — | — | — | — | — |
| 62 | — | — | — | data 1 3 | 1 | 2 | — | r2 | — | — | — | — | — | — |
| 63 | — | — | — | data 1 3 | 1 | 2 | — | r2 | — | — | — | — | — | — |
| 64 | 2 | 1 | req 3 | open | 1 | 2 | — | r2 | — | — | — | — | — | — |
| 65 | 2 | 1 | read | close | 1 | 3 | — | r2 | — | — | — | — | — | — |
| 66 | 2 | 1 | pend 3 | precharged 1 | 1 | 3 | — | — | — | — | — | — | — | — |
| 67 | 2 | 1 | strobe 2 | — | 1 | 3 | — | — | — | — | — | — | — | — |
| 68 | 2 | 2 | — | data 2 0 | 1 | 3 | — | — | — | — | — | — | — | — |
| 69 | 2 | 2 | — | data 2 0 | — | — | — | p1 | — | — | — | — | — | — |
| 70 | 2 | 2 | — | data 2 0 | — | — | — | p1 | — | — | — | — | — | — |
| 71 | 2 | 2 | — | data 2 0 | — | — | — | p1 | — | — | — | — | — | — |
| 72 | 2 | 3 | — | data 2 1 | — | — | — | p1 | — | — | — | — | — | — |
| 73 | 2 | 3 | — | data 2 1 | 2 | 0 | — | p1 | — | — | — | — | — | — |
| 74 | 2 | 3 | — | data 2 1 | 2 | 0 | — | p1 | — | — | — | — | — | — |
| 75 | 2 | 3 | — | data 2 1 | 2 | 0 | — | p1 | — | — | — | — | — | — |
| 76 | — | — | — | data 2 2 | 2 | 0 | — | p1 | — | — | — | — | — | — |
| 77 | — | — | — | data 2 2 | 2 | 1 | — | — | — | — | — | — | — | — |
| 78 | — | — | — | data 2 2 | 2 | 1 | — | s3 | — | — | — | — | — | — |
| 79 | — | — | — | data 2 2 | 2 | 1 | — | s3 | — | — | — | — | — | — |
| 80 | — | term 2 | | data 2 3 | 2 | 1 | — | s3 | — | — | — | — | — | — |
| 81 | — | — | — | data 2 3 | 2 | 2 | — | s3 | — | — | — | — | — | — |
| 82 | — | — | — | data 2 3 | 2 | 2 | — | s3 | — | — | — | — | — | — |
| 83 | — | — | — | data 2 3 | 2 | 2 | — | s3 | — | — | — | — | — | — |
| 84 | — | — | — | — | 2 | 2 | — | s3 | — | — | — | — | — | — |
| 85 | — | — | — | — | 2 | 3 | — | s3 | — | — | — | — | — | — |
| 86 | — | — | — | — | 2 | 3 | — | r3 | — | — | — | — | — | — |
| 87 | — | — | — | — | 2 | 3 | — | r3 | — | — | — | — | — | — |
| 88 | 3 | 1 | wakeup 4 | — | 2 | 3 | — | r3 | — | — | — | — | — | — |
| 89 | 3 | 1 | — | — | 3 | 0 | p2 | r3 | — | — | — | — | — | — |
| 90 | 3 | 1 | strobe 3 | — | 3 | 0 | p2 | r3 | — | — | — | — | — | — |
| 91 | 3 | 1 | — | — | 3 | 0 | p2 | r3 | — | — | — | — | — | — |
| 92 | 3 | 2 | req 4 | open | 3 | 0 | p2 | r3 | — | — | — | — | — | — |
| 93 | 3 | 2 | write | close | 3 | 0 | p2 | r3 | — | — | — | — | — | — |
| 94 | 3 | 2 | pend 2 | precharged 0 | 3 | 0 | p2 | — | — | — | — | — | — | — |
| 95 | 3 | 2 | — | turn | 3 | 1 | p2 | — | — | — | — | — | — | — |
| 96 | 3 | 3 | — | data 3 0 | 3 | 1 | p2 | — | — | — | — | — | — | — |
| 97 | 3 | 3 | — | data 3 0 | 3 | 1 | — | — | — | — | — | — | — | — |
| 98 | 3 | 3 | — | data 3 0 | 3 | 1 | s4 | — | — | — | — | — | — | — |
| 99 | 3 | 3 | — | data 3 0 | 3 | 2 | s4 | — | — | — | — | — | — | — |
| 100 | — | — | — | data 3 1 | 3 | 2 | s4 | — | — | — | — | — | — | — |
| 101 | — | — | — | data 3 1 | 3 | 2 | s4 | — | — | — | — | — | — | — |
| 102 | — | — | — | data 3 1 | 3 | 2 | s4 | — | — | — | — | — | — | — |

-continued

| | | | | | | | | | | | |
|---|---|---|---|---|---|---|---|---|---|---|---|
| 103 | — | term 3 | data 3 1 | 3 3 | s4 | — | — | — | — | — | — | — |
| 104 | — | — | data 3 2 | 3 3 | s4 | — | — | — | — | — | — | — |
| 105 | — | — | data 3 2 | 3 3 | s4 | — | — | — | — | — | — | — |
| 106 | — | — | data 3 2 | 3 3 | r4 | — | — | — | — | — | — | — |
| 107 | — | — | data 3 2 | — | r4 | — | — | — | — | — | — | — |
| 108 | — | wakeup 5 | data 3 3 | — | r4 | p3 | — | — | — | — | — | — |
| 109 | — | — | data 3 3 | — | r4 | p3 | — | — | — | — | — | — |
| 110 | — | — | data 3 3 | — | r4 | p3 | — | — | — | — | — | — |
| 111 | — | — | data 3 3 | — | r4 | p3 | — | — | — | — | — | — |
| 112 | 4 1 | req 5 | open | — | r4 | p3 | — | — | — | — | — | — |
| 113 | 4 1 | write | close | — | r4 | p3 | — | — | — | — | — | — |
| 114 | 4 1 | pend 2 | precharged 1 | — | — | p3 | — | — | — | — | — | — |
| 115 | 4 1 | strobe 4 | — | — | — | p3 | — | — | — | — | — | — |
| 116 | 4 2 | — | data 4 0 | — | — | — | — | — | — | — | — | — |
| 117 | 4 2 | — | data 4 0 | — | — | — | — | — | — | — | — | — |
| 118 | 4 2 | — | data 4 0 | — | — | s5 | — | — | — | — | — | — |
| 119 | 4 2 | — | data 4 0 | — | — | s5 | — | — | — | — | — | — |
| 120 | 4 3 | — | data 4 1 | — | — | s5 | — | — | — | — | — | — |
| 121 | 4 3 | — | data 4 1 | 4 0 | — | s5 | — | — | — | — | — | — |
| 122 | 4 3 | — | data 4 1 | 4 0 | — | s5 | — | — | — | — | — | — |
| 123 | 4 3 | — | data 4 1 | 4 0 | — | s5 | — | — | — | — | — | — |
| 124 | — | — | data 4 2 | 4 0 | — | s5 | — | — | — | — | — | — |
| 125 | — | — | data 4 2 | 4 1 | — | s5 | — | — | — | — | — | — |
| 126 | — | — | data 4 2 | 4 1 | — | r5 | — | — | — | — | — | — |
| 127 | — | — | data 4 2 | 4 1 | — | r5 | — | — | — | — | — | — |
| 128 | — | term 4 | data 4 3 | 4 1 | — | r5 | — | — | — | — | — | — |
| 129 | — | — | data 4 3 | 4 2 | — | r5 | — | — | — | — | — | — |
| 130 | — | — | data 4 3 | 4 2 | — | r5 | — | — | — | — | — | — |
| 131 | — | — | data 4 3 | 4 2 | — | r5 | — | — | — | — | — | — |
| 132 | 5 1 | req 6 | open | 4 2 | — | r5 | — | — | — | — | — | — |
| 133 | 5 1 | read | close | 4 3 | — | r5 | — | — | — | — | — | — |
| 134 | 5 1 | pend 3 | precharged 0 | 4 3 | — | — | — | — | — | — | — | — |
| 135 | 5 1 | strobe 5 | — | 4 3 | — | — | — | — | — | — | — | — |
| 136 | 5 2 | — | data 5 0 | 4 3 | — | — | — | — | — | — | — | — |
| 137 | 5 2 | — | data 5 0 | — | p4 | — | — | — | — | — | — | — |
| 138 | 5 2 | — | data 5 0 | — | p4 | — | — | — | — | — | — | — |
| 139 | 5 2 | — | data 5 0 | — | p4 | — | — | — | — | — | — | — |
| 140 | 5 3 | — | data 5 1 | — | p4 | — | — | — | — | — | — | — |
| 141 | 5 3 | — | data 5 1 | 5 0 | p4 | — | — | — | — | — | — | — |
| 142 | 5 3 | — | data 5 1 | 5 0 | p4 | — | — | — | — | — | — | — |
| 143 | 5 3 | — | data 5 1 | 5 0 | p4 | — | — | — | — | — | — | — |
| 144 | — | — | data 5 2 | 5 0 | p4 | — | — | — | — | — | — | — |
| 145 | — | — | data 5 2 | 5 1 | — | — | — | — | — | — | — | — |
| 146 | — | — | data 5 2 | 5 1 | s6 | — | — | — | — | — | — | — |
| 147 | — | — | data 5 2 | 5 1 | s6 | — | — | — | — | — | — | — |
| 148 | — | term 5 | data 5 3 | 5 1 | s6 | — | — | — | — | — | — | — |
| 149 | — | — | data 5 3 | 5 2 | s6 | — | — | — | — | — | — | — |
| 150 | — | — | data 5 3 | 5 2 | s6 | — | — | — | — | — | — | — |
| 151 | — | — | data 5 3 | 5 2 | s6 | — | — | — | — | — | — | — |
| 152 | — | — | — | 5 2 | s6 | — | — | — | — | — | — | — |
| 153 | — | — | — | 5 3 | s6 | — | — | — | — | — | — | — |
| 154 | — | — | — | 5 3 | r6 | — | — | — | — | — | — | — |
| 155 | — | — | — | 5 3 | r6 | — | — | — | — | — | — | — |
| 156 | 6 1 | wakeup 7 | — | 5 3 | r6 | — | — | — | — | — | — | — |
| 157 | 6 1 | — | — | 6 0 | r6 | p5 | — | — | — | — | — | — |
| 158 | 6 1 | strobe 6 | — | 6 0 | r6 | p5 | — | — | — | — | — | — |
| 159 | 6 1 | — | — | 6 0 | r6 | p5 | — | — | — | — | — | — |
| 160 | 6 2 | req 7 | open | 6 0 | r6 | p5 | — | — | — | — | — | — |
| 161 | 6 2 | read | close | 6 0 | r6 | p5 | — | — | — | — | — | — |
| 162 | 6 2 | pend 2 | precharged 1 | 6 0 | — | p5 | — | — | — | — | — | — |
| 163 | 6 2 | — | turn | 6 1 | — | p5 | — | — | — | — | — | — |
| 164 | 6 3 | — | data 6 0 | 6 1 | — | p5 | — | — | — | — | — | — |
| 165 | 6 3 | — | data 6 0 | 6 1 | — | — | — | — | — | — | — | — |
| 166 | 6 3 | — | data 6 0 | 6 1 | — | s7 | — | — | — | — | — | — |
| 167 | 6 3 | — | data 6 0 | 6 2 | — | s7 | — | — | — | — | — | — |
| 168 | — | — | data 6 1 | 6 2 | — | s7 | — | — | — | — | — | — |
| 169 | — | — | data 6 1 | 6 2 | — | s7 | — | — | — | — | — | — |
| 170 | — | — | data 6 1 | 6 2 | — | s7 | — | — | — | — | — | — |
| 171 | — | term 6 | data 6 1 | 6 3 | — | s7 | — | — | — | — | — | — |
| 172 | — | — | data 6 2 | 6 3 | — | s7 | — | — | — | — | — | — |
| 173 | — | — | data 6 2 | 6 3 | — | s7 | — | — | — | — | — | — |
| 174 | — | — | data 6 2 | 7 0 | — | r7 | — | — | — | — | — | — |
| 175 | — | — | data 6 2 | 7 0 | — | r7 | — | — | — | — | — | — |
| 176 | — | — | data 6 3 | 7 0 | p6 | r7 | — | — | — | — | — | — |
| 177 | — | — | data 6 3 | 7 0 | p6 | r7 | — | — | — | — | — | — |
| 178 | — | — | data 6 3 | 7 0 | p6 | r7 | — | — | — | — | — | — |
| 179 | — | — | data 6 3 | 7 0 | p6 | r7 | — | — | — | — | — | — |
| 180 | — | — | — | 7 0 | p6 | r7 | — | — | — | — | — | — |
| 181 | — | — | — | 7 0 | p6 | r7 | — | — | — | — | — | — |
| 182 | — | — | — | 7 0 | p6 | — | — | — | — | — | — | — |

-continued

| | | | | | | | | | | | | | |
|---|---|---|---|---|---|---|---|---|---|---|---|---|---|
| 183 | — — | — | 7 0 | p6 | — | — | — — | — | — | — | — |
| 184 | 7 1 wakeup 8 | — | 7 0 | — | — | — | — — | — | — | — | — |
| 185 | 7 1 — | — | 7 0 | — | — | — | — — | — | — | — | — |
| 186 | 7 1 strobe 7 | — | 7 0 | — | — | — | — — | — | — | — | — |
| 187 | 7 1 — | — | 7 0 | — | — | — | — — | — | — | — | — |
| 188 | 7 2 req 8 | open | 7 0 | — | — | — | — — | — | — | — | — |
| 189 | 7 2 read | close | 7 0 | — | — | — | — — | — | — | — | — |
| 190 | 7 2 pend 2 | precharged 0 | 7 0 | — | — | — | — — | — | — | — | — |
| 191 | 7 2 — | turn | 7 1 | — | — | — | — — | — | — | — | — |
| 192 | 7 3 — | data 7 0 | 7 1 | — | — | — | — — | — | — | — | — |
| 193 | 7 3 — | data 7 0 | 7 1 | — | — | — | — — | — | — | — | — |
| 194 | 7 3 — | data 7 0 | 7 1 | s8 | — | — | — — | — | — | — | — |
| 195 | 7 3 — | data 7 0 | 7 2 | s8 | — | — | — — | — | — | — | — |
| 196 | — — | data 7 1 | 7 2 | s8 | — | — | — — | — | — | — | — |
| 197 | — — | data 7 1 | 7 2 | s8 | — | — | — — | — | — | — | — |
| 198 | — — | data 7 1 | 7 2 | s8 | — | — | — — | — | — | — | — |
| 199 | — term 7 | data 7 1 | 7 3 | s8 | — | — | — — | — | — | — | — |
| 200 | — — | data 7 2 | 7 3 | s8 | — | — | — — | — | — | — | — |
| 201 | — — | data 7 2 | 7 3 | s8 | — | — | — — | — | — | — | — |
| 202 | — — | data 7 2 | 8 0 | r8 | — | — | — — | — | — | — | — |
| 203 | — — | data 7 2 | 8 0 | r8 | — | — | — — | — | — | — | — |
| 204 | 8 1 wakeup 9 | data 7 3 | 8 0 | r8 | p7 | — | — — | — | — | — | — |
| 205 | 8 1 — | data 7 3 | 8 0 | r8 | p7 | — | — — | — | — | — | — |
| 206 | 8 1 strobe 8 | data 7 3 | 8 0 | r8 | p7 | — | — — | — | — | — | — |
| 207 | 8 1 — | data 7 3 | 8 0 | r8 | p7 | — | — — | — | — | — | — |
| 208 | 8 2 — | — | 8 0 | r8 | p7 | — | — — | — | — | — | — |
| 209 | 8 2 — | — | 8 0 | r8 | p7 | — | — — | — | — | — | — |
| 210 | 8 2 — | — | 8 0 | — | p7 | — | — — | — | — | — | — |
| 211 | 8 2 — | turn | 8 1 | — | p7 | — | — — | — | — | — | — |
| 212 | 8 3 — | data 8 0 | 8 1 | — | — | — | — — | — | — | — | — |
| 213 | 8 3 — | data 8 0 | 8 1 | — | — | — | — — | — | — | — | — |
| 214 | 8 3 — | data 8 0 | 8 1 | — | — | — | — — | — | — | — | — |
| 215 | 8 3 — | data 8 0 | 8 2 | — | — | — | — — | — | — | — | — |
| 216 | — — | data 8 1 | 8 2 | — | — | — | — — | — | — | — | — |
| 217 | — — | data 8 1 | 8 2 | — | — | — | — — | — | — | — | — |
| 218 | — — | data 8 1 | 8 2 | — | — | — | — — | — | — | — | — |
| 219 | — term 8 | data 8 1 | 8 3 | — | — | — | — — | — | — | — | — |
| 220 | — — | data 8 2 | 8 3 | — | — | — | — — | — | — | — | — |
| 221 | — — | data 8 2 | 8 3 | — | — | — | — — | — | — | — | — |
| 222 | — — | data 8 2 | 8 3 | — | — | — | — — | — | — | — | — |
| 223 | — — | data 8 2 | — | — | — | — | — — | — | — | — | — |
| 224 | — — | data 8 3 | — | p8 | — | — | — — | — | — | — | — |
| 225 | — — | data 8 3 | — | p8 | — | — | — — | — | — | — | — |
| 226 | — — | data 8 3 | — | p8 | — | — | — — | — | — | — | — |
| 227 | — — | data 8 3 | — | p8 | — | — | — — | — | — | — | — |
| 228 | — — | — | — | p8 | — | — | — — | — | — | — | — |
| 229 | — — | — | — | p8 | — | — | — — | — | — | — | — |
| 230 | — — | — | — | p8 | — | — | — — | — | — | — | — |
| 231 | — — | — | — | p8 | — | — | — — | — | — | — | — |

APPENDIX C

Explanation of Transaction Templates

1.0 Introduction

This appendix contains a transaction template that shows the information that is communicated over a channel and the internal DRAM core states that occur during a series of transactions.

Timing information proceeds down the template, with each horizontal row representing a clock cycle or two bus samples. Each row represents 4 ns at 500 MHz or 3.75 ns at 533 MHz.

1.1 Clk Cyc Column

The first column, labeled clock cycles, represents the time in clock cycles since the beginning of this template.

1.2 BE Column

The 2nd column labeled BE, is the state of the BusEnable pin during that clock cycle. BusEnable is only used to send serial addresses to the RDRAM.

1.3 BC Column

The 3rd column labeled BC, is the state of the BusCtrl pin during that clock cycle. BusCtrl is used to send request packets, strobe, terminate and wakeup information. During a request packet, this fields identifies the request number, so requests and data can be tracked, the request type, and the value of the Pend field for that transaction. For wakeup, strobes, and terminates it also indicates which transaction is being started, strobed and terminated, by the value carried with it, i.e. (strobe 0)

1.4 BD[8:0] Column

The 4th column, labeled BD[8:0], is the state of the BusData wires during that clock cycle. During the data packet it indicates the transaction number and the octbyte being sent or received. During request packets it indicates the state of the control bits Open and Close. These bits are used to tell the RDRAM what core operations to perform. The state that is assumed for the bank being accessed and the addressed bank is also included in the last field of a request packet.

1.5 DRAM internal state columns

The 5th through 9th Columns represent the activity in an RDRAM labeled 0, with the 5th column being it's CAS activity, and the next four being the activity or state of each of the 4 banks (Bank[0:3]). The 10th through 14th Columns represent the activity in any other RDRAM, labeled 1, with the 10th column being it's CAS activity, and the next four being the activity or state of each of the 4 banks (Bank[0:3]).

1.6 Column encoding

The column encodings consist of two numbers. The first is the request number. The second is the octbyte number.

1.7 Bank[0:3] encodings.

These columns include a symbol that represents an operation and the number of the transaction that caused the operation. The meaning of the symbols is given in the table below.

| Symbol | Name | Meaning | Length |
|---|---|---|---|
| p | Precharge | Precharge is the closing of a page (deassertion of RAS) and can be caused by closing at the end of a transaction, or opening a page that has not previously been precharged | 8 Clocks |
| s | Sense | Sense is the operation of loading the sense amps to prepare for a CAS and is caused by a command with Open required | 8 Clocks |
| r | RAS | RAS always follows the sense, and is needed to insure that the minimum RAS low time of the core is met. | 8 Clocks |

| | | | | Vary data size, retirement order, outstanding requests, data time | | | | | | | | | |
|---|---|---|---|---|---|---|---|---|---|---|---|---|---|
| Clk | | | | !0 | Bank | | | | !1 | Bank | | | ! |
| Cyc | BE BC | | BD[8:0] | !Col | 0 | 1 | 2 | 3 | !Col | 0 | 1 | 2 | 3 | ! |
| 0 | — | wakeup 0 | — | — | — | — | — | — | — | — | — | — | — |
| 1 | — | — | — | — | — | — | — | — | — | — | — | — | — |
| 2 | — | — | — | — | — | — | — | — | — | — | — | — | — |
| 3 | — | — | — | — | — | — | — | — | — | — | — | — | — |
| 4 | — | req 0 | no-open | — | — | — | — | — | — | — | — | — | — |
| 5 | — | read | no-close | — | — | — | — | — | — | — | — | — | — |
| 6 | — | pend 1 | sensed 0 | — | — | — | — | — | — | — | — | — | — |
| 7 | — | — | — | — | — | — | — | — | — | — | — | — | — |
| 8 | 0 1 | wakeup 1 | — | — | — | — | — | — | — | — | — | — | — |
| 9 | 0 1 | — | — | — | — | — | — | — | — | — | — | — | — |
| 10 | 0 1 | strobe 0 | — | — | — | — | — | — | — | — | — | — | — |
| 11 | 0 1 | — | — | 0 0 | — | — | — | — | — | — | — | — | — |
| 12 | — | req 1 | no-open | 0 0 | — | — | — | — | — | — | — | — | — |
| 13 | — | read | no-close | 0 0 | — | — | — | — | — | — | — | — | — |
| 14 | — | pend 2 | sensed 0 | 0 0 | — | — | — | — | — | — | — | — | — |
| 15 | — | term 0 | turn | 0 1 | — | — | — | — | — | — | — | — | — |
| 16 | — | — | data 0 0 | 0 1 | — | — | — | — | — | — | — | — | — |
| 17 | — | — | data 0 0 | 0 1 | — | — | — | — | — | — | — | — | — |
| 18 | — | — | data 0 0 | 0 1 | — | — | — | — | — | — | — | — | — |
| 19 | — | — | data 0 0 | — | — | — | — | — | — | — | — | — | — |
| 20 | 1 1 | wakeup 2 | data 0 1 | — | — | — | — | — | — | — | — | — | — |
| 21 | 1 1 | — | data 0 1 | — | — | — | — | — | — | — | — | — | — |
| 22 | 1 1 | strobe 1 | data 0 1 | — | — | — | — | — | — | — | — | — | — |
| 23 | 1 1 | — | data 0 1 | 1 0 | — | — | — | — | — | — | — | — | — |
| 24 | 1 2 | req 2 | no-open | 1 0 | — | — | — | — | — | — | — | — | — |
| 25 | 1 2 | read | no-close | 1 0 | — | — | — | — | — | — | — | — | — |
| 26 | 1 2 | pend 3 | sensed 0 | 1 0 | — | — | — | — | — | — | — | — | — |
| 27 | 1 2 | — | turn | 1 1 | — | — | — | — | — | — | — | — | — |
| 28 | 1 3 | — | data 1 0 | 1 1 | — | — | — | — | — | — | — | — | — |
| 29 | 1 3 | — | data 1 0 | 1 1 | — | — | — | — | — | — | — | — | — |
| 30 | 1 3 | — | data 1 0 | 1 1 | — | — | — | — | — | — | — | — | — |
| 31 | 1 3 | — | data 1 0 | 1 2 | — | — | — | — | — | — | — | — | — |
| 32 | — | — | data 1 1 | 1 2 | — | — | — | — | — | — | — | — | — |
| 33 | — | — | data 1 1 | 1 2 | — | — | — | — | — | — | — | — | — |
| 34 | — | — | data 1 1 | 1 2 | — | — | — | — | — | — | — | — | — |
| 35 | — | term 1 | data 1 1 | 1 3 | — | — | — | — | — | — | — | — | — |
| 36 | — | — | data 1 2 | 1 3 | — | — | — | — | — | — | — | — | — |
| 37 | — | — | data 1 2 | 1 3 | — | — | — | — | — | — | — | — | — |

-continued

| | | | | | | | | | | | | |
|---|---|---|---|---|---|---|---|---|---|---|---|---|
| 38 | — | — | data 1 2 | 1 3 | — | — | — | — | — | — | — | — |
| 39 | — | — | data 1 2 | — | — | — | — | — | — | — | — | — |
| 40 | — | wakeup 3 | data 1 3 | — | — | — | — | — | — | — | — | — |
| 41 | — | — | data 1 3 | — | — | — | — | — | — | — | — | — |
| 42 | — | — | data 1 3 | — | — | — | — | — | — | — | — | — |
| 43 | — | — | data 1 3 | — | — | — | — | — | — | — | — | — |
| 44 | — | req 3 | open | — | — | — | — | — | — | — | — | — |
| 45 | — | read | no-close | — | — | — | — | — | — | — | — | — |
| 46 | — | pend 5 | sensed 0 | — | — | — | — | — | — | — | — | — |
| 47 | — | — | — | — | — | — | — | — | — | — | — | — |
| 48 | — | wakeup 4 | — | — | — | — | — | — | — | — | — | — |
| 49 | — | — | — | — | — | — | — | — | — | — | — | — |
| 50 | — | strobe 2 | — | — | p3 | — | — | — | — | — | — | — |
| 51 | — | term 2 | — | 2 0 | p3 | — | — | — | — | — | — | — |
| 52 | — | req 4 | no-open | 2 0 | p3 | — | — | — | — | — | — | — |
| 53 | — | read | no-close | 2 0 | p3 | — | — | — | — | — | — | — |
| 54 | — | pend 0 | sensed 0 | 2 0 | p3 | — | — | — | — | — | — | — |
| 55 | — | — | turn | — | p3 | — | — | — | — | — | — | — |
| 56 | — | — | data 2 0 | — | p3 | — | — | — | — | — | — | — |
| 57 | — | — | data 2 0 | — | p3 | — | — | — | — | — | — | — |
| 58 | — | strobe 4 | data 2 0 | — | s3 | — | — | — | — | — | — | — |
| 59 | — | term 4 | data 2 0 | — | s3 | — | — | 4 0 | — | — | — | — |
| 60 | — | — | — | — | s3 | — | — | 4 0 | — | — | — | — |
| 61 | — | — | — | — | s3 | — | — | 4 0 | — | — | — | — |
| 62 | — | — | — | — | s3 | — | — | 4 0 | — | — | — | — |
| 63 | — | — | turn | — | s3 | — | — | — | — | — | — | — |
| 64 | — | — | data 4 0 | — | s3 | — | — | — | — | — | — | — |
| 65 | — | — | data 4 0 | — | s3 | — | — | — | — | — | — | — |
| 66 | — | strobe 3 | data 4 0 | 3 0 | r3 | — | — | — | — | — | — | — |
| 67 | — | term 3 | data 4 0 | 3 0 | r3 | — | — | — | — | — | — | — |
| 68 | — | — | — | 3 0 | r3 | — | — | — | — | — | — | — |
| 69 | — | — | — | 3 0 | r3 | — | — | — | — | — | — | — |
| 70 | — | — | — | 3 0 | r3 | — | — | — | — | — | — | — |
| 71 | — | — | turn | — | r3 | — | — | — | — | — | — | — |
| 72 | — | — | data 3 0 | — | r3 | — | — | — | — | — | — | — |
| 73 | — | — | data 3 0 | — | r3 | — | — | — | — | — | — | — |
| 74 | — | — | data 3 0 | — | — | — | — | — | — | — | — | — |
| 75 | — | — | data 3 0 | — | — | — | — | — | — | — | — | — |

What is claimed is:

1. A method, for use by a memory controller coupled to a memory device over a bus, for deferring precharge decisions, the method comprising the steps of:

transmitting a request packet to the memory device over a first number of lines of the bus, wherein the request packet specifies a data transfer operation;

receiving requests for additional data transfer operations while the memory device is performing the data transfer operation;

determining, based on the requests received for the additional transfer transactions, whether a precharge operation should be initiated after the data transfer operation;

transmitting to the memory device over a second number of lines of the bus, at or about the end of the data transfer operation, a control signal that indicates whether a precharge operation should be initiated after the data transfer operation, wherein the second number of lines is less than the first number of lines.

2. The method of claim 1 wherein the step of transmitting the control signal is performed by transmitting a termination signal to the memory device, the memory device terminating the data transfer operation at a time that is based on when the memory device receives the termination signal.

3. The method of claim 2 wherein:

the memory device is configured to terminate the data transfer operation after a particular data packet is transmitted if the memory device detects the termination signal on any one of a plurality of clock cycles;

the memory controller indicates that a precharge operation is to be performed by transmitting the termination signal on a particular clock cycle of the plurality of clock cycles;

the memory controller indicates that a precharge operation is not to be performed by transmitting the termination signal on a different clock cycle of the plurality of clock cycles; and the memory device initiates a precharge operation based the clock cycle on which the termination signal is detected by the memory device.

4. The method of claim 2 wherein:

the memory device contains a plurality of banks;

the memory device terminates the data transfer operation after a particular data packet is transmitted if the memory device detects the termination signal on any one of a plurality of clock cycles;

the method further includes the step of establishing a correspondence between the plurality of clock cycles and the plurality of banks;

the memory controller indicates a bank within the memory device on which a precharge operation is to be performed by transmitting the termination signal on the clock cycle of the plurality of clock cycles that corresponds to the bank; and the memory device initiates a precharge operation on the bank that corresponds to the clock cycle on which the memory device detects the termination signal.

5. A memory for storing data and performing data transfer operations, the memory comprising:

a memory array integrated within the memory to store data; and a control circuitry integrated within the memory and coupled to a bus, the control circuitry configured to read control information carried on the bus, the control information including data that specifies a data transfer operation and a first address;

the control circuitry configured to perform the specified data transfer operation on data stored in the memory beginning at the first address, the control circuitry configured to perform the specified data transfer operation on data stored beginning at additional locations specified in address information carried over the bus until detecting a terminate indication on the bus, the control circuitry configured to cease the data transfer operation at a time that is based on the time at which the terminate indication is detected.

6. The memory of claim 5, wherein the control circuitry is further configured to read address information carried on one or more lines of the bus while performing the specified data transfer operation using one or more other lines of the bus, and wherein the address information specifies where data involved in the specified data transfer operation is located.

7. The memory device of claim 5, wherein the control circuitry is further configured to detect a strobe signal on the bus and to begin performing the specified data transfer operation at a time based on the time at which the strobe signal is detected.

8. The memory device of claim 7 wherein the control information specifies a location of a first set of data, the control circuitry configured to retrieve the first set of data from the location prior to detecting the strobe signal.

9. The memory device of claim 8 wherein:

the control circuitry is further configured to read address information from one or more lines of the bus, the address information specifies locations for one or more additional sets of data to be transmitted in the data transfer operation, the control circuitry retrieves the one or more additional sets of data upon reading the address information, and the control circuitry transmits the one or more additional sets of data after transmitting the first set of data.

10. A memory for storing data and performing data transfer operations, the memory comprising:

an array to store memory data; and a control circuit integrated within the memory, the control circuit coupled to a bus and configured to read control information carried on the bus, the control information containing control data that specifies a data transfer operation and a first address of the memory data;

the control circuit configured to perform the specified data transfer operation on the memory data beginning at the first address, the memory configured to terminate the data transfer operation at a time based on detection of a terminate indication on the bus.

11. The memory of claim 10, wherein the control circuit is further configured to detect a strobe signal on the bus and to begin performing the specified data transfer operation at a time based on detection of the strobe signal on the bus.

12. A memory for storing data and performing data transfer operations, the memory comprising:

an array on a substrate to store memory data; and a control circuit on the substrate coupled to a bus, the control circuit configured to read control information carried on the bus, the control information containing control data that specifies a data transfer operation and a first address of the memory data and a location of a first set of data;

the control circuit configured to perform the specified data transfer operation on the memory data beginning at the first address, the control circuit configured to detect a strobe signal on the bus and to begin performing the specified data transfer operation at a time based on detection of the strobe signal on the bus, the control circuit configured to retrieve the first set of data from the location prior to detection of the strobe signal.

13. The memory of claim 12, wherein the control circuit is further configured to read address information carried on one or more lines of the bus while performing the specified data transfer operation using one or more other lines of the bus, and wherein the address information specifies where data involved in the specified data transfer operation is located.

14. The memory of claim 12, wherein the memory is contained within a package.

* * * * *